(12) United States Patent
Schulze et al.

(10) Patent No.: US 11,764,063 B2
(45) Date of Patent: Sep. 19, 2023

(54) SILICON CARBIDE DEVICE WITH COMPENSATION REGION AND METHOD OF MANUFACTURING

(71) Applicant: Infineon Technologies AG, Neubiberg (DE)

(72) Inventors: Hans-Joachim Schulze, Taufkirchen (DE); Romain Esteve, Prisdorf (DE); Moriz Jelinek, Villach (AT); Caspar Leendertz, Munich (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/886,175

(22) Filed: May 28, 2020

(65) Prior Publication Data
US 2020/0381253 A1 Dec. 3, 2020

(30) Foreign Application Priority Data

May 28, 2019 (DE) .......................... 102019114312.8

(51) Int. Cl.
*H01L 21/04* (2006.01)
*H01L 29/16* (2006.01)
(Continued)

(52) U.S. Cl.
CPC ........ *H01L 21/047* (2013.01); *H01L 29/0634* (2013.01); *H01L 29/1608* (2013.01); *H01L 29/7813* (2013.01)

(58) Field of Classification Search
CPC ............... H01L 21/047; H01L 29/0634; H01L 29/1608; H01L 29/781; H01L 29/04; H01L 29/7397; H01L 29/0623; H01L 29/0696; H01L 29/0878; H01L 29/1095; H01L 29/66068; H01L 21/265; H01L 29/0603; H01L 29/78; H01L 29/7813
See application file for complete search history.

(56) References Cited

U.S. PATENT DOCUMENTS

| 9,070,580 B2 | 6/2015 | Willmeroth et al. |
| 2012/0074489 A1* | 3/2012 | Hsieh .................. H01L 29/7811 257/330 |

(Continued)

FOREIGN PATENT DOCUMENTS

DE 102017131274 B3 5/2019

OTHER PUBLICATIONS

H. Kang, et al., "Material Limit of Power Devices—Applied to Asymmetric 2-D Superjunction MOSFET", IEEE Transactions on Electron Devices, vol. 65, No. 8, Aug. 2018, pp. 3326-3332.

*Primary Examiner* — Cuong B Nguyen
(74) *Attorney, Agent, or Firm* — COOPER LEGAL GROUP, LLC

(57) ABSTRACT

A silicon carbide substrate is provided that includes a drift layer of a first conductivity type and a trench extending from a main surface of the silicon carbide substrate into the drift layer. First dopants are implanted through a first trench sidewall of the trench. The first dopants have a second conductivity type and are implanted at a first implant angle into the silicon carbide substrate, wherein at the first implant angle channeling occurs in the silicon carbide substrate. The first dopants form a first compensation layer extending parallel to the first trench sidewall.

22 Claims, 18 Drawing Sheets

(51) Int. Cl.
*H01L 29/06* (2006.01)
*H01L 29/78* (2006.01)

(56) References Cited

U.S. PATENT DOCUMENTS

| | | |
|---|---|---|
| 2015/0028350 A1 | 1/2015 | Suvorov et al. |
| 2016/0380117 A1* | 12/2016 | Bhalla ................ H01L 29/0657 257/77 |
| 2017/0338302 A1 | 11/2017 | Hsieh et al. |
| 2018/0138266 A1 | 5/2018 | Hans-Joachim et al. |
| 2019/0088482 A1 | 3/2019 | Schulze et al. |

* cited by examiner

SILICON CARBIDE DEVICE WITH COMPENSATION REGION AND METHOD OF MANUFACTURING

RELATED APPLICATION

This application claims priority to German Patent Application No. 102019114312.8, filed on May 28, 2019, entitled "SILICON CARBIDE DEVICE WITH COMPENSATION REGION AND METHOD OF MANUFACTURING", which is incorporated by reference herein in its entirety.

TECHNICAL FIELD

Examples of the present disclosure relate to a silicon carbide device, for example to a silicon carbide device with compensation structure and to methods of manufacturing silicon carbide devices with compensation structure.

BACKGROUND

The most significant difference between conventional power semiconductor devices and power semiconductor devices superjunction power devices is a series of lateral junctions between n doped regions and p doped regions in the voltage-sustaining layer of the superjunction power semiconductor device. A lateral depletion effect inside the voltage sustaining layer facilitates high voltage blocking capability at comparatively low on-state resistance. A prerequisite for high voltage blocking capability is sufficient charge balance between the n doped regions and the p doped regions in the voltage-sustaining layer. The fabrication of silicon superjunction devices typically includes a multi-epitaxy/multi-implant process with masked p-type doping or with both masked p-type and masked n-type doping per layer, a multi-implant process at different implant energies or a trench etch process combined with epitaxial growth in the trench or with a trench-wall gas-phase doping process. Forming compensation structures with sufficiently well-defined charge compensation gets more challenging if the diffusion coefficient of the semiconductor material is low.

There is a need for providing a silicon carbide device including a compensation structure with well-defined charge compensation at competitive costs.

SUMMARY

An embodiment of the present disclosure relates to a method of manufacturing a silicon carbide device. The method includes providing a silicon carbide substrate including a drift layer of a first conductivity type and a trench that extends from a main surface of the silicon carbide substrate into the drift layer. First dopants are implanted through a first trench sidewall of the trench. The first dopants have a second conductivity type and are implanted at a first implant angle into the silicon carbide substrate, wherein at the first implant angle channeling occurs in the silicon carbide substrate. The first dopants form a first compensation layer that extends parallel to the first trench sidewall.

An embodiment of the present disclosure relates to a method of manufacturing a silicon carbide device. The method includes providing a silicon carbide substrate including a drift layer of a first conductivity type and a trench that extends from a main surface of the silicon carbide substrate into the drift layer. First dopants are implanted through a first trench sidewall of the trench. The first dopants have a second conductivity type and form a first compensation layer that extends parallel to the first trench sidewall. Second dopants are implanted through the first trench sidewall. The second dopants have the first conductivity type and form a second compensation layer. The first compensation layer and the second compensation layer form a pn junction.

An embodiment of the present disclosure relates to a silicon carbide device including a silicon carbide body. A gate structure extends from a first surface into the silicon carbide body. A fill structure is between the gate structure and a second surface of the silicon carbide body, wherein the second surface is opposite to the first surface. A compensation region of a first conductivity type is between the gate structure and the second surface. A first compensation layer of a second conductivity type is between a first sidewall of the fill structure and the compensation region. A second compensation layer of the first conductivity type extends parallel to the first sidewall. The first compensation layer and the second compensation layer form a pn junction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and a method of manufacturing a silicon carbide device and together with the description serve to explain principles of the embodiments. Further embodiments are described in the following detailed description and the claims.

DETAILED DESCRIPTION

Figure 1A:
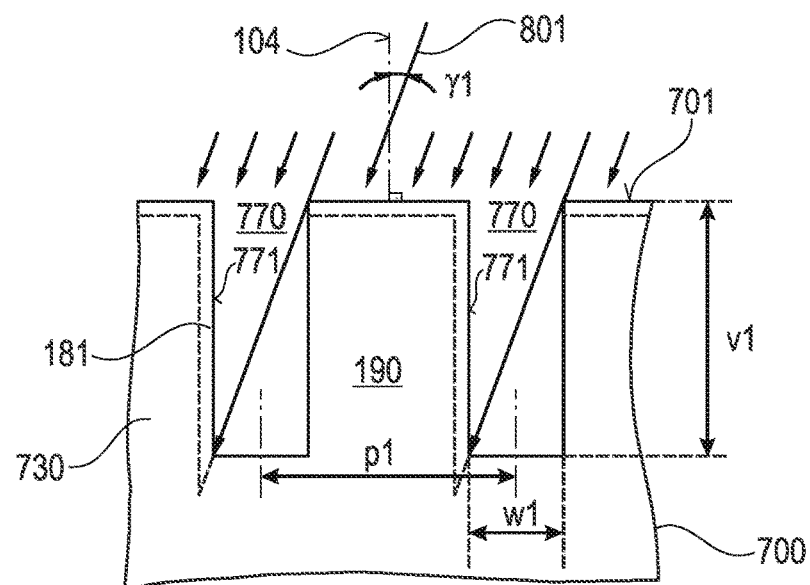
FIGS. 1A-1C show simplified vertical cross-sectional views of a portion of a silicon carbide substrate for illustrating a method of forming a silicon carbide device with compensation structure according to an embodiment.

In the following detailed description, reference is made to the accompanying drawings, which form a part hereof and in which are shown by way of illustrations specific embodiments in which a silicon carbide device and a method of manufacturing a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening elements adapted for signal and/or power transmission may be connected between the electrically coupled elements, for example, elements that are controllable to temporarily provide a low-resistive connection in a first state and a high-resistive electric decoupling in a second state.

An ohmic contact is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

As regards structures and doped regions formed in a silicon carbide body, a second region is "below" a first region if a minimum distance between the second region and a first surface at the front side of the silicon carbide body is greater than a maximum distance between the first region and the first surface. The second region is "directly below" the first region, where the vertical projections of the first and second regions into the first surface overlap. The vertical projection is a projection orthogonal to the first surface. A "horizontal plane" is a plane parallel to a planar first surface or parallel to a mean plane of a ripped surface.

The term "power semiconductor device" refers to semiconductor devices with high voltage blocking capability of at least 30 volts (V), for example 100 V, 600 V, 3.3 kilovolts (kV) or more and a nominal on-state current or forward current of at least 1 ampere (A), for example, 10 A or more.

According to an embodiment, a method of manufacturing a silicon carbide device may include providing a silicon carbide substrate.

The silicon carbide substrate may consist of or include a silicon carbide disc or silicon carbide wafer cut from a single-crystalline silicon carbide ingot. For example, the silicon carbide substrate may include an epitaxial layer and/or a substrate portion, wherein the substrate portion may be obtained from a single-crystalline silicon carbide ingot, e.g., by sawing. A diameter of the silicon carbide substrate may correspond to a production standard for semiconductor wafers, and may be, by way of example 2 inch (51 millimeters (mm)), 3 inch (76 mm), 4 inch (100 mm), 150 mm (6 inch) or 200 mm (8 inch).

The silicon carbide substrate may be 15R—SiC (silicon carbide of 15R polytype), 2H—SiC, 4H—SiC or 6H—SiC, by way of example. In addition to the main constituents silicon and carbon, the silicon carbide substrate may include dopant atoms, for example nitrogen N, phosphorus P, beryllium Be, boron B, aluminum Al, and/or gallium Ga. Further, the silicon carbide substrate may include unwanted impurities, for example, hydrogen, fluorine and/or oxygen.

The silicon carbide substrate may have two parallel, flat main surfaces of the same shape and size and a lateral surface area connecting the edges of the two main surfaces. For example, the silicon carbide substrate may be a polygonal (e.g., rectangular or hexagonal) prism with or without rounded edges or a right cylinder with or without one or more flats or notches.

The silicon carbide substrate extends along horizontal directions (also called "lateral directions" in the following) and may have a thickness along a vertical direction orthogonal to the horizontal directions, wherein the thickness is small compared to the horizontal directions.

The silicon carbide substrate may include a drift layer of a first conductivity type and a trench extending from a first main surface into the drift layer. The drift layer may extend across the complete horizontal cross-sectional area of the silicon carbide substrate and may have a uniform vertical extension. The drift layer may be formed by epitaxy and may have a mean net dopant concentration in a range from $1\times10^{15}$ centimeters $(cm)^{-3}$ to $1\times10^{19}$ cm$^{-3}$, for example from $3\times10^{15}$ cm$^{-3}$ to $3\times10^{18}$ cm$^{-3}$. For example, the mean net dopant concentration in the drift layer may be in a range from $1\times10^{15}$ cm$^{-3}$ to $2\times10^{17}$ cm$^{-3}$ or from $3\times10^{15}$ cm$^{-3}$ to $1\times10^{17}$ cm$^{-3}$. According to another example, the mean net dopant concentration in the drift layer may be in a range from $1\times10^{16}$ cm$^{-3}$ to $1\times10^{19}$ cm$^{-3}$, for example in a range from $3\times10^{16}$ cm$^{-3}$ to $3\times10^{18}$ cm$^{-3}$.

The trench may be a needle-like trench with two orthogonal lateral extensions within the same order of magnitude or may be stripe-shaped with a first lateral extension at least ten times as large as a second, orthogonal lateral extension.

First dopants may be implanted through at least a first trench sidewall of the trench, e.g., by ion beam implantation. The first dopants have a second conductivity type and form a first compensation layer that extends parallel to the first sidewall. The first compensation layer may have an approximately uniform lateral extension. A vertical extension of the first compensation layer in the drift layer may be at least along 90% of the vertical extension of the trench. Within the first compensation layer, the dopant concentration may vary as a function of a distance to the first trench sidewall along a horizontal direction. For example, a lateral dopant profile in the first compensation layer may have one, two or more local maxima. In a plane parallel to the first trench sidewall, the dopant concentration in the first compensation layer may be approximately uniform across at least 30% or at least 50% or even at least 90% of the vertical extension of the trench. The first compensation layer may directly adjoin the first trench sidewall or may be formed at a distance to the first trench sidewall.

The first dopants may be implanted at a first implant angle at which channeling occurs in the silicon carbide substrate. Channeling occurs when the implant axis is parallel to a main crystal direction along which the crystal lattice forms continuous lattice channels. Channeling may also occur when the implant axis deviates by not more than ±1.5, for example not more than ±0.5°, degree from a main crystal direction with continuous lattice channels. Since in the lattice channels the dopant ions encounter small-angle scattering (and/or the dopant ions predominantly encounter only small-angle scattering) as they pass through the several layers of atoms of the crystal lattice, the dopant atoms may remain in the same lattice channel and may penetrate deeper (e.g., significantly deeper) into the substrate than outside the lattice channels.

For example, for 4H—SiC a crystal direction along which channeling occurs is the <11-23> direction. For example, the axis of the ion implant beam may be tilted with respect to the <0001> lattice direction by 17 degree. In some examples, for the <11-23> lattice channel, six orientations of the ion implant beam with an angle of 17 degree with respect to the <0001> direction may exist. The first trench sidewall may, for example, be a (11-20) crystal plane. In case of an off-axis angle of the <0001> lattice direction with respect to the vertical direction, the ion implant beam may be tilted to the vertical direction by 17 degree plus or minus the off-axis angle (plus or minus depending on the orientation of the ion implant beam with respect to the off-axis angle). For example, for an off-axis angle of 4 degree, the ion implant beam may be tilted to the vertical direction by about 21 degree (i.e., (17+4) degree) or 13 degree (i.e., (17−4) degree). Also, other implant angles in a range from 6 degree to 60 degree with respect to the <0001> lattice direction are possible.

By forming a plurality of trenches and by performing an implantation, e.g., a channeled implantation, through at least a first trench sidewall of each of the trenches, the first compensation layers and portions of the drift layer between the first compensation layers form a compensation structure that may facilitate high voltage breakdown capability (e.g., voltage breakdown capability higher than a threshold voltage breakdown capability) at low on-state resistance (e.g., on-state resistance lower than a threshold on-state resistance). A compensation structure with comparatively large vertical extension (e.g., vertical extension larger than a threshold vertical extension) can be formed at comparatively low implant energy (e.g., implant energy lower than a threshold implant energy). The lower implant energy of a channeled implant may facilitate the use of a comparatively thin implant mask (e.g., an implant mask with a thickness smaller than a threshold thickness), wherein the implant mask may shield doped regions or structures outside the compensation structure against the implant. The trenches allow extending the vertical extension of compensation layers beyond an upper limit for high-energy implants through the main surface. The first compensation layer may have a comparatively narrow horizontal width (e.g., a horizontal width smaller than a threshold horizontal width) such that it is possible to provide neighboring first compensation layers at a comparatively small center-to-center distance (e.g., a center-to-center distance smaller than a threshold center-to-center distance). For the case that a first compensation layer will be implemented (and/or that only the first compensation layer is implemented), it is possible to control the doping of the epitaxially deposited drift zone in a way to achieve a sufficiently exact drift zone doping compensation (e.g., the doping of the epitaxially deposited drift zone may be controlled to achieve a drift zone doping compensation with an accuracy exceeding a threshold accuracy and/or a precision exceeding a threshold precision). For example, the doping concentration of the epitaxially deposited drift zone may be chosen in a range from $1\times10^{16}$ cm$^{-3}$ to $1\times10^{19}$ cm$^{-3}$, for example in a range from $3\times10^{16}$ cm$^{-3}$ to $3\times10^{18}$ cm$^{-3}$.

The channeled implant may increase (e.g., significantly increase) the range of the implanted dopants and may reduce (e.g., significantly reduce) the portion of ions reflected at the trench sidewall. A greater portion of the ions are implanted along the target direction. A desired degree of charge balance in the compensation structure may be achieved more precisely. A possible out-diffusion of the implanted dopants during the subsequent high-temperature acts may be suppressed or may even be substantially avoided by this channeling technique.

According to an embodiment, second dopants may be implanted through the first trench sidewall prior to or after implanting the first dopants. The second dopants have the first conductivity type and may form a second compensation layer. The first and the second compensation layers may form a pn junction. For example, the first compensation layer may be formed along the first trench sidewall and between the first trench sidewall and the second compensation layer.

Alternatively, the second compensation layer may be formed between the trench sidewall and the first compensation layer. Even if the first compensation layer is wider than the second compensation layer an attractive superjunction performance may be reached. For example, in case the first conductivity type is n-type, the large implantation depth for aluminum ions may facilitate the formation of comparatively narrow first and second compensation layers (e.g., the first compensation layer may be formed having a width smaller than a first threshold width and/or the second compensation layer may be formed having a width smaller than a second threshold width).

The dopant concentration in the second compensation layer may be greater than (e.g., significantly greater than) a mean dopant concentration in the drift layer. For example, the maximum dopant concentration in the second compensation layer is at least one, for example, at least two orders of magnitude greater than the maximum dopant concentration in the drift layer. The greater the portion of the implanted dopants of the second conductivity type is with respect to the dopants in the drift layer, the more precisely the ratio between the two dopant types in the compensation structure can be adjusted.

According to at least one further embodiment, another silicon carbide substrate may be provided. The silicon carbide substrate may include a drift layer of a first conductivity type and a trench that may extend from a main surface of the silicon carbide substrate into the drift layer. First dopants may be implanted through a first trench sidewall of the trench. The first dopants may have a second conductivity type and may form a first compensation layer. The first compensation layer may extend parallel to the first trench sidewall. Second dopants may be implanted through the first trench sidewall. The second dopants may have the first conductivity type and may form a second compensation layer. The first and the second compensation layers may form a pn junction.

For example, the first compensation layer may be formed along the first trench sidewall and between the first trench sidewall and the second compensation layer. Alternatively, the second compensation layer may be formed between the trench sidewall and the first compensation layer.

A compensation structure with comparatively large vertical extension (e.g., vertical extension larger than a threshold vertical extension) and with comparatively precisely defined degree of charge balance (e.g., a degree of charge balance defined with a precision exceeding a threshold precision) can be formed at comparatively low implant energy (e.g., implant energy lower than a threshold implant energy).

According to an embodiment, the first dopants may be implanted at a first implant angle, wherein at the first implant angle channeling may occur in the silicon carbide substrate. The channeled implant may increase (e.g., significantly increase) the range of the implanted dopants and may reduce (e.g., significantly reduce) the portion of ions reflected at the trench sidewall. It is possible that a greater portion of the ions are implanted along the target direction. A desired degree of charge balance in the compensation structure may be achieved more precisely. A possible out-diffusion of the implanted dopants during the subsequent high-temperature acts may be suppressed or may even be substantially avoided.

According to an embodiment, the second dopants may be implanted at a second implant angle at which channeling occurs in the silicon carbide substrate. The second implant angle may be an angle at which channeling occurs. The first implant angle at which channeling occurs and the second implant angle at which channeling occurs may be the same angle or may be different angles. The implant energy for implanting the second dopants may be higher than (e.g., significantly higher than) the implant energy used for implanting the first dopants such that the second dopants spatially overlap with the first compensation layer only to a low degree (e.g., second dopants may spatially overlap with the first compensation layer to a degree lower than a threshold degree of overlapping). The second compensation layer may be formed spaced from the trench by the first compensation layer.

According to an embodiment a channeled implant for the second dopants may be combined with a non-channeled implant for the first dopants such that the first compensation layer has a comparatively small width in a lateral direction (e.g., a width smaller than a threshold width). The lateral width of the second dopants is defined rather by the shape of the implant peak than by an implant mask. The width of both the first and the second compensation layers can be comparatively narrow (e.g., the first compensation layer may have a width smaller than a first threshold width and/or the second compensation layer may have a width smaller than a second threshold width). If the implants for both the first and the second dopants use channeling, the second implant angle may be equal to the first implant angle.

According to an embodiment, further first dopants may be implanted through a second trench sidewall of the trench, wherein the second trench sidewall is opposite to the first trench sidewall and wherein the further first dopants form a further first compensation layer parallel to the second sidewall. In this way, a plurality of doped regions of a compensation structure may be realized in each portion of the silicon carbide substrate between neighboring trenches.

According to an embodiment, further second dopants may be implanted through the second trench sidewall. The further second dopants may form a further second compensation layer parallel to the second trench sidewall.

According to an embodiment, the further first and/or the further second dopants may be implanted at an implant angle at which channeling occurs in the silicon carbide substrate.

The further second compensation layers may form one continuous, combined second compensation layer, wherein a portion of the silicon carbide substrate between neighboring trenches may be formed without a lightly doped portion of a drift layer.

According to an embodiment, third dopants of the second conductivity type may be implanted through the first trench sidewall at an implant angle at which channeling occurs in the silicon carbide substrate. The implantation energy may be higher than the implant energy for implanting the first and the second dopants. The third dopants may form a third compensation layer at a side of the second compensation layer averted from the trench. In other words, the third compensation layer is formed at a side of the second compensation layer facing away from the first trench sidewall through which the third dopants are implanted.

First, second, and third dopants may also be implanted through the second trench sidewall of a neighboring trench of the same or approximately the same implantation energy, implantation dose and/or implantation angle used for implanting the first, second and third dopants through the first trench sidewalls. The two trenches may be formed at a distance small enough such that the third dopants implanted through the first trench sidewall of the first trench and the third dopants implanted though the second trench sidewall of the second trench may form one combined laterally contiguous third compensation layer. The combined third compensation layer may be formed in the lateral center of a SiC region formed by a portion of the silicon carbide substrate between the two trenches.

The doping of the first, second and third compensation layers can be adjusted separately to facilitate a high degree of charge compensation (e.g., a degree of charge compensation higher than a threshold degree of charge compensation) within the SiC region. According to other embodiments, one or more further implants under an implant angle at which channeling occurs and with increasing energy and varying doping may be performed to form a structure with a plurality of vertical compensation layers of alternating doping type. The compensation layers may have different widths and the implant dose can be selected individually to provide a desired ratio of charge balance.

According to an embodiment, a fill structure may be formed in the trench. The fill structure may be formed after forming at least the first compensation layer. The fill structure may include semiconductor material and/or insulator material, e.g., an insulating layer, an insulator fill material, intrinsic silicon carbide and/or lightly doped silicon carbide.

A gate electrode may be formed between the main surface and the fill structure. The gate electrode may be part of a gate electrode structure that includes the gate electrode and a gate dielectric, wherein the gate dielectric separates the gate electrode from at least a body region of the second conductivity type. Before forming the gate electrode structure, the silicon carbide substrate may be recessed at the front side and/or an epitaxial layer may be formed at the front side after formation of the first and, if applicable, the second compensation layer or the second and the third compensation layers. The resulting device may be a SiC superjunction (SJ) trench MOSFET (TMOSFET) with a nominal breakdown voltage greater than 3 kilovolts (kV). For example, in SiC SJ-TMOSFETs with a nominal breakdown voltage greater 3 kV, the resistance of the silicon carbide portion between the transistor channel and the rear side electrode contribute to a higher degree (e.g., a significantly higher degree) to the overall on-state resistance than in SiC TMOSFETs with lower breakdown voltage capability.

According to an embodiment, a fill structure may be formed in the trench after forming the first compensation layer, after forming the first and the second compensation layers, or after forming the first, the second and the third compensation layers. An epitaxial layer may be formed on the main surface, e.g., by epitaxy. A further trench may be formed in the epitaxial layer and may expose the fill structure. Further first dopants may be implanted through a further first sidewall of the further trench in the epitaxial layer to form a compensation layer extension of the first compensation layer in the epitaxial layer.

In this way it is possible to increase the vertical extension of the superjunction structure compared to methods using energy filters in combination with high or ultra-high energy implantation for forming a compensation structure based on a superjunction structure in silicon carbide. Compared to a multi-epi/multi-implant process, the number of epitaxial layers can be reduced (e.g., significantly reduced). For example, for a silicon carbide device with a nominal breakdown voltage of 3.3 kV, a multi-epi/multi-implant process may need five to six epitaxial layers at maximum implant energy of 20 mega electron volts (MeV). By forming compensation layers along sidewalls of trenches, it may be possible to reduce the number of epitaxial layers to only three (and/or to a different number of epitaxial layers) and/or to reduce the required implantation energy (e.g., reduce the required implantation energy significantly).

According to an embodiment, the first dopants or the first dopants and the second dopants may also be implanted through the main surface and may form horizontal portions of the first compensation layer or horizontal portions of the first and the second compensation layers at the main surface. After forming the first compensation layer or after forming the first and second compensation layers, a sacrificial layer that includes the horizontal portions may be removed.

The implants through the sidewalls may be carried out without using an implant mask (and/or without using any implant mask), because the non-usable horizontal portions of the compensation layers can be removed at low effort.

According to an embodiment, prior to forming the first compensation layer or prior to forming the first and second compensation layers, an implantation mask may be formed on the main surface. An opening in the implantation mask may expose the trench. The implantation mask may shield portions of the main surface against the tilted implants.

According to an embodiment, fourth dopants of the second conductivity type may be implanted through a bottom of the trench. The implanted fourth dopants form a first supplemental compensation region. Implanting the fourth dopants may include a high energy implant through an energy filter such that the implanted fourth dopants may have an approximately uniform energy distribution and distribute approximately uniformly in the first supplemental compensation region. In other words, a vertical dopant profile of the first supplemental compensation region is approximately uniform ("box-shaped"). According to other embodiments, the implant of the fourth dopants may include an implant with varying implant energy or is performed under varying implant angles to approximate a "box-shaped" dopant profile. In this way, it is possible to further increase the vertical extension of the superjunction structure at only low additional effort.

According to an embodiment, a silicon carbide device may include a silicon carbide body. The silicon carbide device may be a power semiconductor device, for example a semiconductor diode, an MPS (merged pin Schottky) diode, an MOSFET (metal oxide semiconductor field effect transistor), an insulated gate bipolar transistor (IGBT) or an MGD (MOS gated diode). The silicon carbide body may include single crystalline SiC.

A gate structure may extend from a first surface of the silicon carbide body into the silicon carbide body. The gate structure may include at least a gate electrode and a gate dielectric, wherein the gate dielectric is formed between the gate electrode and the silicon carbide body. The gate structure may include further conductive and dielectric structures in addition to the gate dielectric and the gate electrode.

A fill structure may be formed between the gate structure and a second surface of the silicon carbide body, wherein the second surface is opposite to the first surface. The fill structure may be formed in a portion of the silicon carbide body below the gate structure. A bottom surface of the gate structure oriented to the second surface may be in contact with a top surface of the fill structure.

A compensation region of a first conductivity type may be formed in the silicon carbide body between the gate structure and the second surface. The compensation region may be formed in a horizontal direction with respect to the fill structure. For example, the compensation region may be formed laterally between two neighboring ones of the fill structures. The fill structure may be part of the compensation structure for the case that the doping level of the fill structure is high enough (e.g., higher than a threshold doping level) and/or well-controlled.

A first compensation layer of a second conductivity type may be formed in the silicon carbide body between the first sidewall of the fill structure and the compensation region. The first compensation layer may be a vertical layer extending parallel to the first sidewall of the fill structure. The first compensation layer may directly adjoin the first sidewall or may be formed at a distance to the first sidewall. The first compensation layer may be in direct contact with the compensation region or may be formed at a distance to the compensation region.

The first compensation layer and the compensation region may form part of a superjunction structure with comparatively precisely defined charge compensation (e.g., a charge compensation defined with a precision exceeding a threshold precision) and with a small center-to-center distance between doped columns of the same conductivity type (e.g., a center-to-center distance smaller than a threshold center-to-center distance). The superjunction structure may contribute to reducing an on-state resistance without loss of voltage blocking capability.

A second compensation layer of the first conductivity type may be formed in the silicon carbide body. The second compensation layer may extend parallel to the first sidewall. The first and the second compensation layers may form a pn junction. For example, the second compensation layer may be formed at a side of the first compensation layer averted from the fill structure such that the first compensation layer is between the fill structure and the second compensation layer. Alternatively, the second compensation layer is formed between the fill structure and the first compensation layer.

The second compensation layer may form a portion of the compensation region of the first conductivity type or may form the compensation region of the first conductivity completely. Alternatively, the second compensation layer may be laterally separated from the compensation region of the first conductivity type.

A maximum dopant concentration in the second compensation layer may be at least $10^{16}$ cm$^{-3}$ or at least $3 \times 10^{16}$ cm$^{-3}$, at least $10^{17}$ cm$^{-3}$, or even at least $1 \times 10^{18}$ cm$^{-3}$. A high dopant concentration (e.g., a dopant concentration higher than a threshold dopant concentration) in both types of doped columns of a superjunction structure may result in a low on-state resistance (e.g., an on-state resistance lower than a threshold on-state resistance) in the current-caring path.

According to an embodiment it is possible that a maximum dopant concentration in the first compensation layer is e.g., at least $10^{16}$ cm$^{-3}$ or at least $3 \times 10^{16}$ cm$^{-3}$ at least $10^{17}$ cm$^{-3}$, or even at least $1 \times 10^{18}$ cm$^{-3}$. A high dopant concentration (e.g., a dopant concentration higher than a threshold dopant concentration) in the doped columns of a superjunction structure including a plurality of the first compensation layers may facilitate a low on-state resistance (e.g., an on-state resistance lower than a threshold on-state resistance) in the current-caring path.

According to an embodiment, a doped horizontal layer may be formed in the silicon carbide body between the fill structure and the second surface. The doped horizontal layer may have the first conductivity type or may include first portions of the first conductivity type and second portions of the second conductivity type alternating along at least one horizontal direction. The horizontal layer and the first compensation layer may form a first tilted junction, wherein the first tilted junction may extend in a first junction plane. A first tilt angle between the first tilted junctions and a vertical direction deviates by not more than ±5 degree from an angle between the vertical direction and a lattice direction, along which channeling occurs. For example, the tilted junction may extend in a plane parallel to a crystal direction in which channeling occurs. The crystal direction in which channeling occurs may be one of the crystal directions described above.

The first tilted junction may be a unipolar junction or a pn junction. The first tilted junction may be defined by a channeled implant, wherein the implanted dopant ions come to rest at a comparatively high distance to the first sidewall (e.g., a distance to the first sidewall higher than a threshold distance).

For example, the silicon carbide body may include 4H—SiC with the first surface having an off-axis angle of about 4° against the <0001> lattice direction. The first tilted junction may have an angle of about 17° against the <0001> lattice direction. The first tilted junction may be tilted to the vertical direction by about 21 degree or by about 13 degree. The crystal direction used for a channeling may be the <11-23> direction, wherein comparatively low implant energies may be sufficient to form comparatively wide first compensation layers (e.g., using the <11-23> direction for the channeling may enable formation of a compensation layer having a first width using a lower implant energy as compared to using some other crystal directions for the channeling).

According to an embodiment, the horizontal layer and the second compensation layer may form a second tilted junction, wherein the second tilted junction may extend along a second junction plane. A second tilt angle between the second tilted junctions and a vertical direction deviates by not more than ±5 degree from an angle between the vertical direction and a lattice direction, along which channeling occurs. For example, the second tilted junction may extend in a plane parallel to a crystal direction in which channeling occurs. The crystal direction in which channeling occurs may be one of the crystal directions described above.

The second tilted junction may be a unipolar junction or a pn junction. The second tilted junction may be defined by a channeled implant, wherein the implanted dopant ions come to rest at a comparatively high distance to the first sidewall (e.g., a distance to the first sidewall higher than a threshold distance). The second tilt angle may be equal to the first tilt angle.

According to an embodiment, the silicon carbide body may include a shielding region of the second conductivity type, wherein at least a portion of the shielding region is formed between the gate structure and the second surface. The shielding region may reduce the electric field in the gate dielectric and may contribute in improving gate dielectric reliability.

According to an embodiment, the shielding region may be in contact with at least a portion of a gate bottom surface of the gate structure and with the first compensation layer. The shielding region may effectively reduce the electric field in the gate dielectric and at the same time may contribute in electrically connecting the first compensation layers with a first load electrode at a front side of the silicon carbide body.

According to an embodiment, a further first compensation layer of the second conductivity type may extend along a second sidewall of the fill structure. The second sidewall of the fill structure is opposite to the first sidewall. Compensation layers of the second conductivity type formed on two opposite sidewalls allow a smaller lateral center-to-center distance between neighboring doped columns of a superjunction structure and may increase the efficiency of the superjunction structure.

According to an embodiment, a first supplemental compensation region of the second conductivity type may be formed in the silicon carbide body between the fill structure and the second surface. The first supplemental compensation region may be in contact with a bottom surface of the fill structure and with the first compensation layer. A vertical dopant profile of the first supplemental compensation region may be approximately uniform ("box-shaped").

The first supplemental compensation structure may increase the total vertical extension of a superjunction structure, wherein the first compensation structure may be formed in an effective way by implanting ions through the bottom of a temporarily formed trench, in which the fill structure is formed (e.g., the fill structure may be formed after implanting the ions through the bottom of the temporarily formed trench). In addition, the first compensation structure may effectively electrically connect first compensation layers formed on opposite sides of the fill structure.

According to an embodiment, a horizontal longitudinal axis of the gate structure may be tilted to a horizontal longitudinal axis of the fill structure. For example, the horizontal longitudinal axis of the gate structure may be orthogonal to the horizontal longitudinal axis of the fill structure. In other words: the gate structures may run perpendicular to the fill structures. A lateral center-to-center distance between neighboring gate structures may be decoupled from a lateral center-to-center distance between neighboring gate structures. Decoupling both center-to-center distances from each other may relax process requirements.

According to an embodiment, the fill structure may include a dielectric material. For example, the fill structure may include an insulating layer extending parallel to the sidewalls of the fill structure, wherein the insulating layer may include one or more dielectric materials. The fill structure may include a fill portion filling a center of the fill structure, wherein the fill structure may include one or more dielectric materials. The fill structure may include semiconducting structures, for example, intrinsic silicon carbide and/or doped crystalline silicon carbide or other conductive structures, wherein the other conductive structures may be insulated against the silicon carbide body. The insulating material may improve the voltage breakdown capability of the fill structure.

Figure 1B:
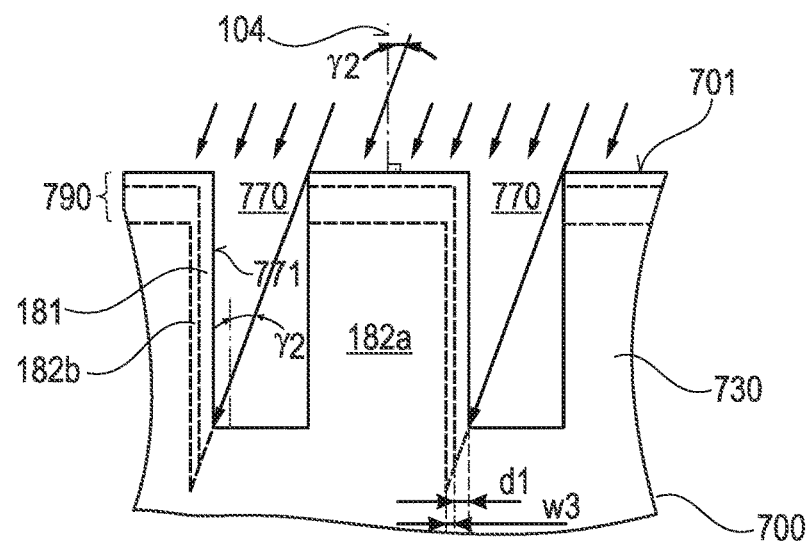
Figure 1C:
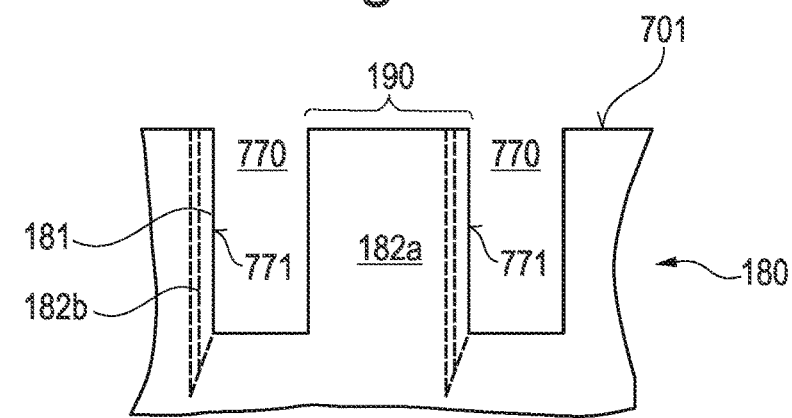

FIGS. 1A to 1C refer to a method of manufacturing a silicon carbide device from a silicon carbide substrate 700. A main surface 701 at a front side of the silicon carbide substrate 700 may be planar or may be ripped. In case of a ripped main surface 701, a planar mean surface of the ripped main surface 701 is regarded as the main surface 701 in the following for simplicity, wherein the mean surface has a minimum distance to all points of the ripped surface. The main surface 701 extends along horizontal directions (also "lateral" directions in the following) and orthogonal to a vertical direction 104.

The following embodiments refer to the manufacture of silicon carbide devices with n-channel transistor cells with n-doped source regions and with p-doped body regions. Accordingly, the conductivity type of the source regions—or first conductivity type—is n-type and the conductivity type of the body regions—or second conductivity type—is p-type. Other embodiments may refer to SiC devices with p-channel transistor cells with p-doped source regions and with n-doped body regions.

The silicon carbide substrate 700 includes a drift layer 730. The drift layer 730 has the first conductivity type and may be uniformly doped or may have a non-uniform vertical dopant profile. The drift layer 730 may be an epitaxial layer or may include an epitaxial grown vertical section. A maximum dopant concentration in the drift layer 730 may be at most $10^{17}$ cm$^{-3}$. A vertical extension of the drift layer 730 may be at least 5 micrometers (μm) or at least 10 μm or even at least 15 μm.

Trenches 770 extend from the main surface 701 into the drift layer 730. Portions of the silicon carbide substrate 700 laterally separating neighboring trenches 770 form SiC portions 190. The trenches 770 may be stripe-shaped with a horizontal longitudinal extension orthogonal to the cross-sectional plane. The horizontal longitudinal extension of the trenches 770 may be at least ten times a trench width w1. Alternatively, the trenches 770 may have two orthogonal horizontal dimensions within the same order of magnitude, e.g., with approximately equal orthogonal horizontal dimensions, wherein the horizontal cross-section of the trenches 770 may be a circle or a regular polygon, e.g., a square.

A trench depth v1 may be in a range from 1 μm to 10 μm, for example, from 2 μm to 6 μm. The trench width w1 may be in a range from 200 nanometers (nm) to 5 μm or in a range between 500 nm and 2 μm. A trench aspect ratio v1:w1 may be in a range from 0.2 to 50 or from 0.3 to 25 or from 0.5 to 5, by way of example. The trench aspect ratio may depend on an implant angle of the implantation. For example, in some examples, such as in the case of an implant angle against the <0001> lattice direction, the trench aspect ratio may be at least 3.0 and at most 3.6. A trench pitch p1 or center-to-center distance between neighboring trenches 770 may be in a range from 0.5 μm to 20 μm or from 1 μm to 10 μm.

First dopants are implanted through first trench sidewalls 771 by ion beam implantation. A first implant angle γ1 between an ion beam axis 801 and the vertical direction 104 may be selected such that the ion beam axis 801 is parallel to or deviates by not more than 2° (e.g., not more than 1.5° or not more than 1° or even not more than 0.5°) from a lattice direction along which channeling occurs in the silicon carbide substrate 700. The trench aspect ratio v1:w1 may be selected such that the tilted implant is uniformly effective across the complete trench depth v1.

The implanted first dopants form first compensation layers 181 of the second conductivity type as shown in FIG. 1A. The first compensation layers 181 include vertical portions extending parallel to the first trench sidewalls 771 and horizontal portions extending parallel to the main surface 701.

Prior to or after the first dopants, second dopants of the first conductivity type may be implanted through the first trench sidewalls 771. The implant of the second dopants may be a channeled implant and/or may use higher implant energies than the implant of the first dopants.

A second implant angle γ2 between an ion beam axis 801 and the vertical direction 104 may be selected such that the ion beam axis 801 is parallel to or deviates by not more than 2° (e.g., not more than 1.5° or not more than 1° or even not more than 0.5°) from a lattice direction along which channeling occurs in the silicon carbide substrate 700. The second implant angle γ2 may deviate from the first implant angle γ1 or may be equal to the first implant angle γ1.

According to FIG. 1B the second dopants form second compensation layers 182b of the first conductivity type at a first distance d1 to the first trench sidewalls 771. A lateral width w3 of the second compensation layers 182b may be smaller than, equal to or greater than the first distance d1. The second compensation layers 182b may include horizontal portions extending parallel to the main surface 701 and vertical portions extending parallel to the first trench sidewalls 771. In each SiC portion 190, a region unaffected by the tilted implants forms a doped second compensation portion 182a of the first conductivity type.

The horizontal portions of the first and second compensation layers 181, 182b may be removed, e.g., by etching or by CMP (chemical mechanical polishing). A filling of the trenches 770 may precede or may follow the removal of the horizontal portions.

FIG. 1C shows the silicon carbide substrate 700 after removal of the horizontal portions of the first and second compensation layers 181, 182b. Each SiC portion 190 includes two oppositely doped columns of a compensation structure 180, wherein the compensation structure 180 forms a superjunction structure. For example, in each SiC portion 190 the second compensation layer 182b and the second compensation portion 182a may form an n-doped column of a superjunction structure and the first compensation layer 181 may form a p-doped column of the superjunction structure.

In case the trenches 770 are filled with one or more insulating materials, the p-doped and the n-doped columns of the compensation structure 180 in each SiC portion 190 can be charged-balanced to a predefined degree, wherein in a horizontal cross-sectional plane of the SiC portion 190 the donor surface integral from one trench 770 to the neighboring trench 770 deviates by not more than ±20% (or not more than ±10% or even not more than ±5% %; optionally by at least 2%) from that of the acceptor surface integral from across the same distance.

In case the trenches 770 are filled with doped semiconductor material, the doped semiconductor material in the trenches 770 may form a portion of the p-type column or a further n-type column of the compensation structure 800. The fill structure may be part of the compensation structure; this may require that the doping level of the fill structure is sufficiently high (e.g., the doping level is higher than a threshold doping level) and/or well-controlled. For the case of an n-doped fill structure, the fill structure may contribute to the flow of the load current.

In a horizontal cross-sectional plane the donor surface integral from the first trench sidewall 771 of a first trench 770 to the first trench sidewall 771 of the neighboring trench 770 deviates by not more than ±20% (or not more than ±10% or even not more than ±5%) from that of the acceptor surface integral across the same distance.

Figure 2A:
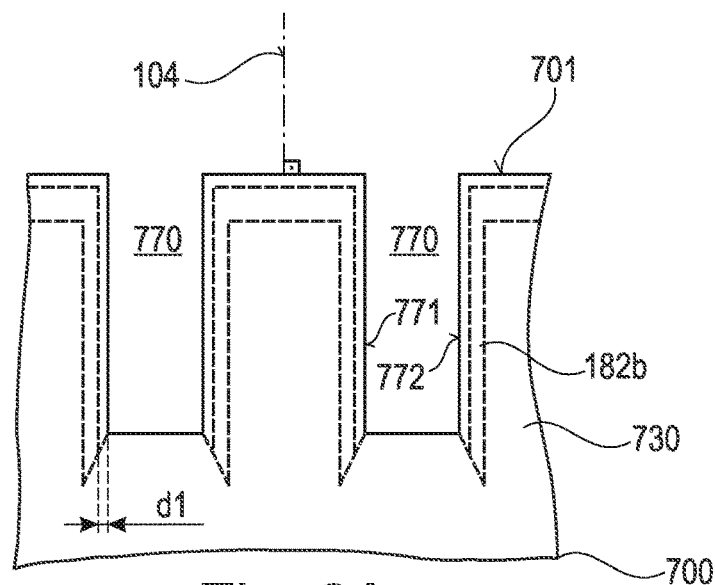
FIGS. 2A-2C show simplified vertical cross-sectional views of a portion of a silicon carbide substrate for illustrating a method of forming a silicon carbide device with compensation layers formed on opposite sidewalls of a trench according to an embodiment.
Figure 2B:
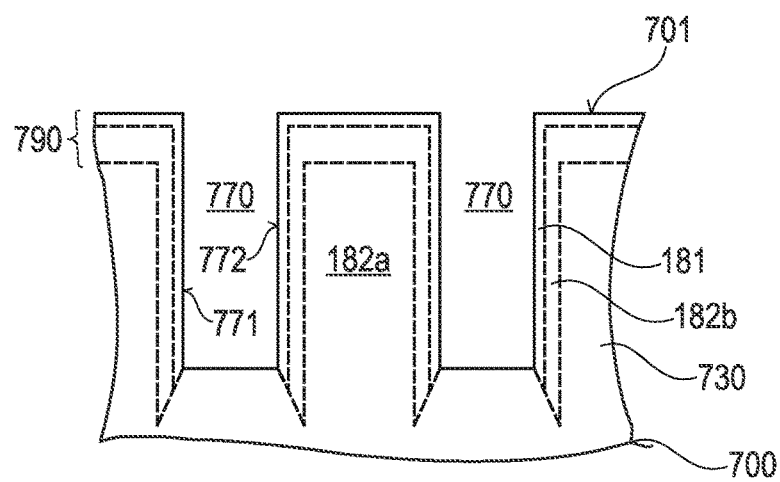
Figure 2C:
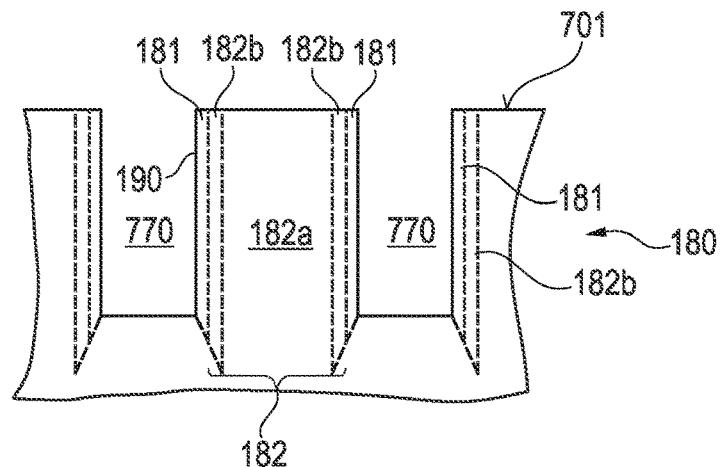

FIGS. 2A-2C show channeled implants for second dopants of the first conductivity type into two opposite trench sidewalls 771, 772, wherein the channeled implants precede two channeled or non-channeled implants for first dopants of the second conductivity type into the two trench sidewalls 771, 772.

As illustrated in FIG. 2A the second dopants form second compensation layers 182b at a distance d1 to the first trench sidewalls 771 and to the second trench sidewalls 772.

FIG. 2B shows first compensation layers 181 formed between the second compensation layers 182b and the first trench sidewalls 771 and formed between the second compensation layers 182b and the second trench sidewalls 772.

FIG. 2C shows the silicon carbide substrate 700 after removal of the horizontal portions of the first and second compensation layers 181, 182b. Each SiC portion 190 includes three doped columns of a compensation structure 180. For example, in each SiC portion 190, the first compensation layers 181 form two p-doped columns of the compensation structure 180 and the second compensation layers 182b and the second compensation portion 182a form one lateral contiguous n-doped column of the compensation structure 180.

In a horizontal cross-sectional plane the donor surface integral from the first trench sidewall 771 of a first trench 770 to the first trench sidewall 771 of the neighboring trench 770 deviates by not more than ±20% (or not more than ±10% or even not more than ±5%; optionally by at least 2%) from that of the acceptor surface integral from the first trench sidewall 771 of the first trench 770 to the first sidewall 771 of the neighboring trench 770.

Figure 3:
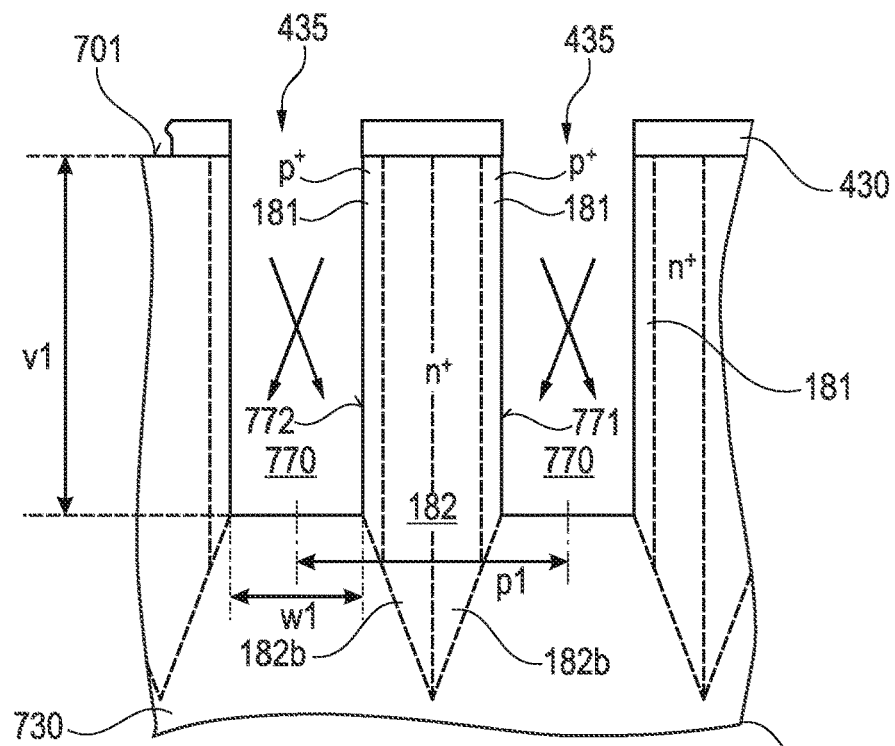
FIG. 3 is a schematic vertical cross-sectional view of a portion of a silicon carbide substrate with directly adjoining n-type compensation layers formed by implants through sidewalls of neighboring trenches.

In FIG. 3 the trench pitch p1 and the trench aspect ratio v1:w1 are selected such that the second compensation layer 182b formed by ion implantation through the first trench sidewall 771 of the left trench 770 and the second compensation layer 182b formed by ion implantation through the second trench sidewall 772 of the right trench 770 adjoin (e.g., directly adjoin) or overlap each other and form one horizontally contiguous n-type second compensation region 182 with high dopant concentration (e.g., dopant concentration higher than a threshold dopant concentration).

In addition, FIG. 3 shows an implantation mask 430 formed on the first main surface 701. For the implant energy used for the sidewall implants, the implantation mask 430 blocks the implantation of dopants through the main surface 701. The implantation mask 430 completely covers the SiC portions 190 between the trenches 770 and may be formed from at least a vertical portion of a trench etch mask used for forming the trenches 770. Forming the trenches 770 may include reactive ion beam etching, by way of example.

Figure 4:
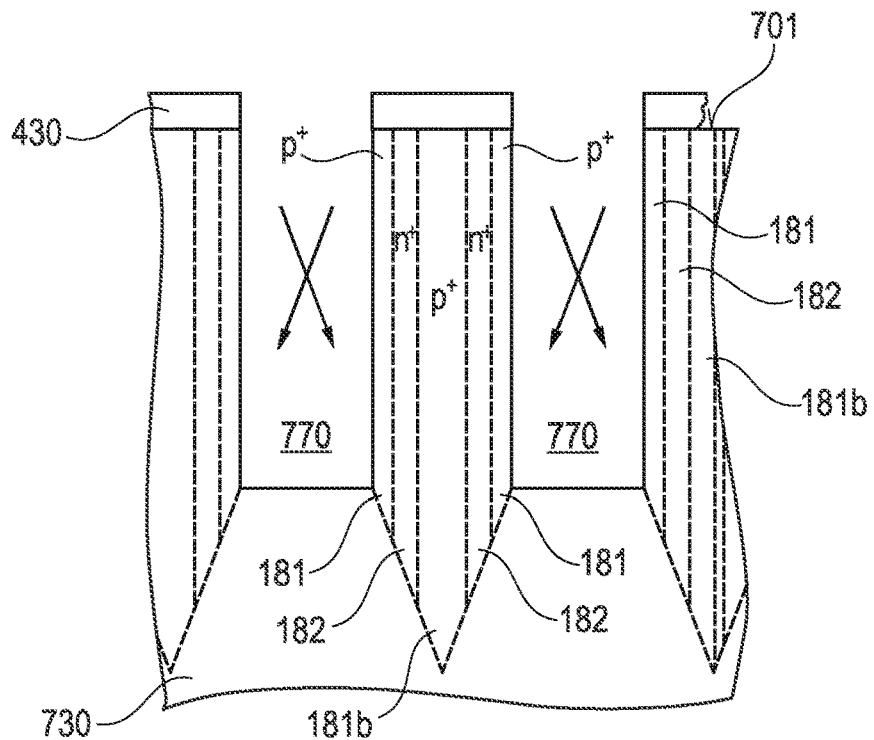
FIG. 4 is a schematic vertical cross-sectional view of a portion of a silicon carbide substrate with a third compensation layer formed by implants through sidewalls of neighboring trenches.

In FIG. 4 a third compensation layer 181b of the second conductivity type is formed between two second compensation layers 182b, which are formed in the same SiC portion 190. A channeled implant may form the third compensation layer 181b. The implants for the second compensation layers 182b and the third compensation layer 181b may use the same implant angle.

With increasing lateral density of n-type columns and p-type columns, the dopant concentration per column may be further increased, wherein the higher dopant concentration in the n-type second compensation region may contribute in further reducing the on-state resistance.

Figure 5A:
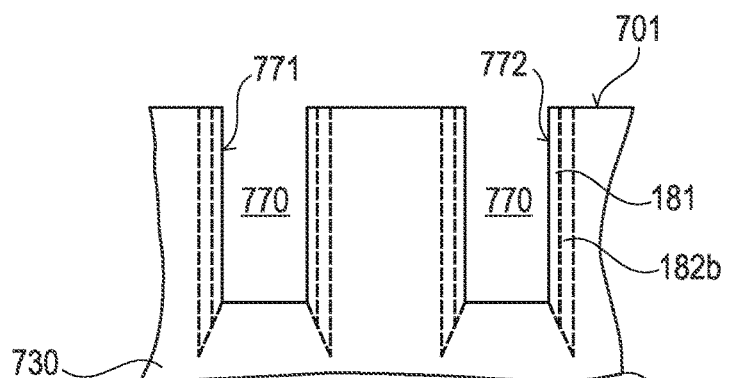
FIGS. 5A-5C show schematic vertical cross-sectional views of a portion of a silicon carbide substrate for illustrating a method of manufacturing a silicon carbide device according to an embodiment including the stacking of trenches in different layers.
Figure 5B:
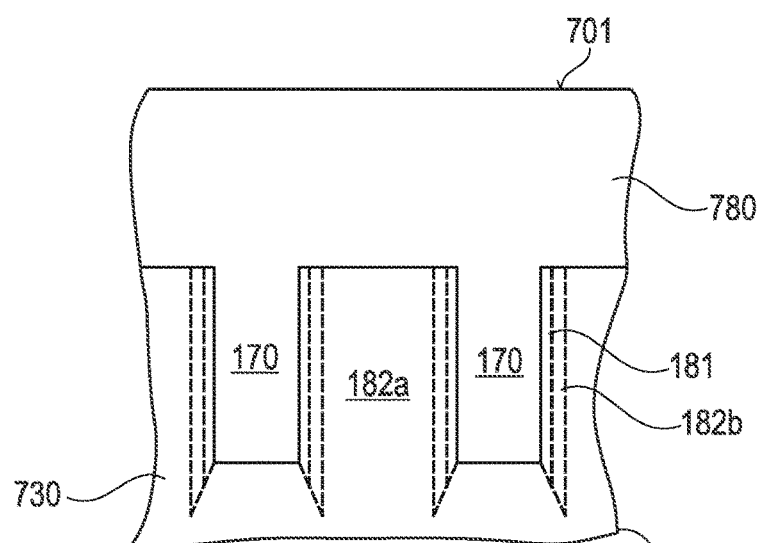
Figure 5C:
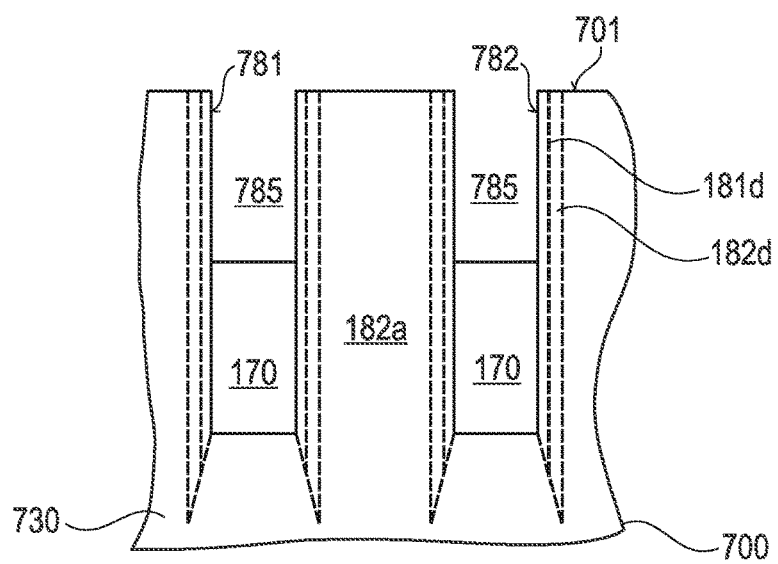

FIGS. 5A-5C illustrate a multi-epi/multi-implant process for forming a compensation structure 180.

FIG. 5A shows a silicon carbide substrate 700 with first and second compensation layers 181, 182b formed on opposite trench sidewalls 771, 772 as described with reference to FIGS. 2A-2C. The trenches 770 may be filled and an epitaxial layer 780 may be formed on the main surface 701 of the silicon carbide substrate 700 of FIG. 5A.

FIG. 5B shows the epitaxial layer 780, wherein a top surface of the epitaxial layer 780 forms the main surface 701 of the silicon carbide substrate 700. A fill structure 170 filling the trenches 770 of FIG. 5A may or may not include epitaxial silicon carbide.

Further trenches 785 are formed in the epitaxial layer 780, wherein each further trench 785 exposes one of the fill structures 170. Tilted implants through the exposed first and second sidewalls 781, 782 of the further trenches 785 form first compensation layer extensions 181d of the first compensation layers 181 and form second compensation layer extensions 182d of the second compensation layers 182b. The further trenches 785 may be filled with a further fill structure. The fill structure 170 and the further fill structure in the further trenches 785 can consist of the same material but can also consist of different materials; e.g., the fill structure 170 can be SiC and the further fill structure in the further trenches 785 can be an isolating layer.

The implant doses and implant energies for forming the compensation layer extensions 181d, 182d may be equal to the implant doses and implant energies for forming the first and second compensation layers 181, 182 in FIG. 5A or may be different. For example, the implant doses for at least one implant may differ to vary the degree of compensation along the vertical direction in a pre-defined way.

For example, the section with the compensation layer extensions 181d, 182d may be more p rich than the section with the first and second compensation layers 181, 182b. In other words, in a horizontal plane intersecting the compensation layer extensions 181d, 182d, the integrated p-doping along a horizontal line may be to a higher degree greater than the integrated n-doping as in a horizontal plane intersecting the first and second compensation layer 181, 182b. In the horizontal plane intersecting the first and second compensation layers 181, 182b, the integrated p-doping along a horizontal line may be smaller than the integrated n-doping ("n rich"), the integrated p-doping may be equal to the integrated n-doping ("completely balanced"), or the integrated p-doping may be greater than the integrated n-doping ("p rich").

Figure 6:
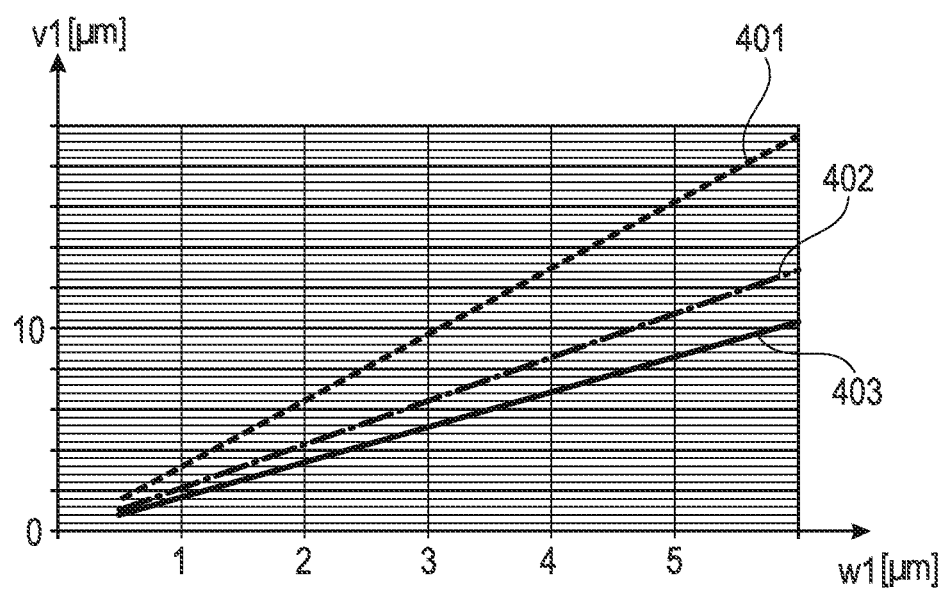
FIG. 6 is a schematic diagram indicating a trench depth as a function of a trench width and the implant angle for discussing embodiments.

In FIG. 6 line 401 shows a maximum vertical extension v1 of the trenches as a function of the trench width w1 for an implant angle of 17° against the <0001> lattice direction (e.g., in the case of a 4° off-axis angle, 21° or 13° to the vertical direction). Line 402 shows the maximum vertical extension v1 of the trenches for an implant angle of 25° and 403 shows the maximum trench width w1 for an implant angle of 30°.

FIGS. 7A-7H refer to the manufacture of SiC SJ-TMOS-FETs (SiC Superjunction Trench MOSFETs) with one-sided channel.

A silicon carbide substrate 700 may include a drift layer 730 with a main drift portion 731 of a first conductivity type and a base portion 710 between the drift layer 730 and a rear side surface 702. At least a portion of the drift layer 730 may be formed by epitaxy. The base portion 710 may include a portion obtained by sawing from a crystal ingot or may be formed by an epitaxy process. At least a portion of the base portion 710 may have a higher dopant concentration than the drift layer 730. The drift layer 730 may be uniformly doped or may show a vertically varying dopant profile. For example, the drift layer 730 may include a main drift portion 731 and a doped horizontal layer 735, wherein the horizontal layer 735 is between the main drift portion 731 and the base portion 710. A mean dopant concentration in the horizontal layer 735 may be equal to or higher than in the main drift portion 731. The horizontal layer 735 may be a buffer layer or a drain zone or a combination of both.

A first mask layer may be deposited on a main surface 701 at the front side of the silicon carbide substrate 700. A second mask layer may be deposited on the first mask layer. Each of the first and second mask layers may be homogeneous layers or may include two or more sub-layers. Each of the first and second mask layers may include silicon nitride, silicon oxide and/or carbon, by way of example.

A photosensitive layer may be deposited on the second mask layer. The photosensitive layer may be patterned by lithography to form a resist mask 410 with openings exposing sections of the second mask layer. The resist mask 410 may be used to pattern the first mask layer and the second mask layer.

Figure 7A:
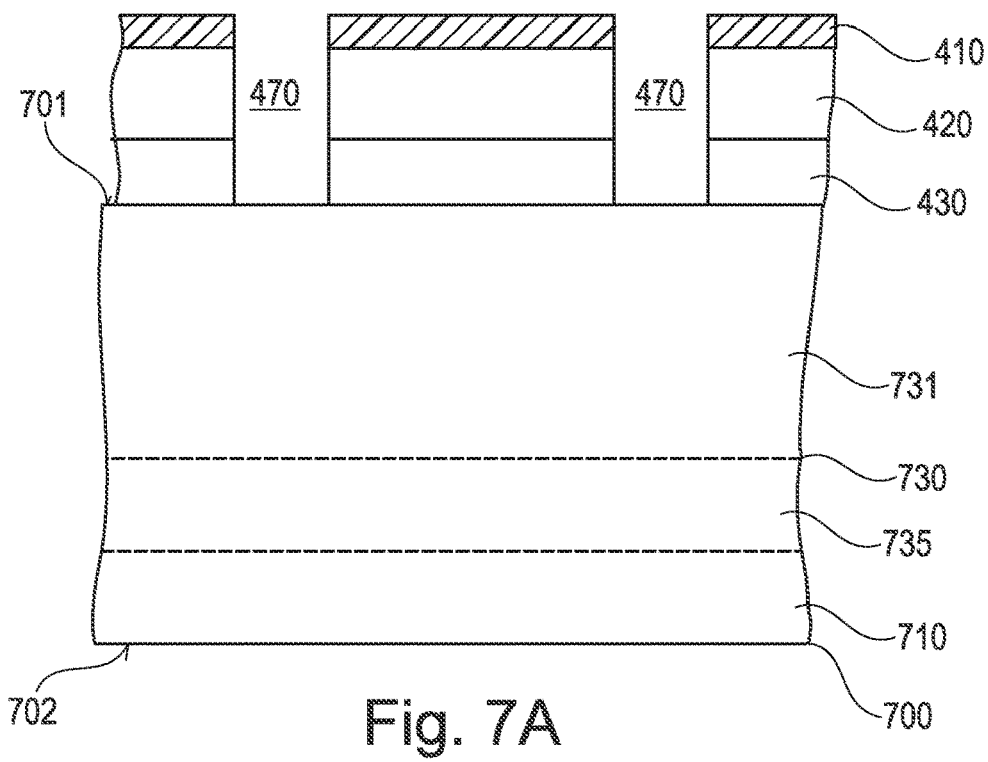
FIGS. 7A-7H show schematic vertical cross-sectional views of a portion of a silicon carbide substrate for illustrating a method of manufacturing a SiC SJ-TMOSFET with one-sided channel according to an embodiment.

FIG. 7A shows mask openings 470 extending through the first and second mask layers and exposing sections of the main surface 701. A residual portion of the first mask layer forms an implantation mask 430. A residual portion of the second mask layer forms a second mask 420.

Residuals of the resist mask 410 may be removed. Trenches 770 may be formed in the exposed sections of the main surface 701, for example, by ion beam etching.

Figure 7B:
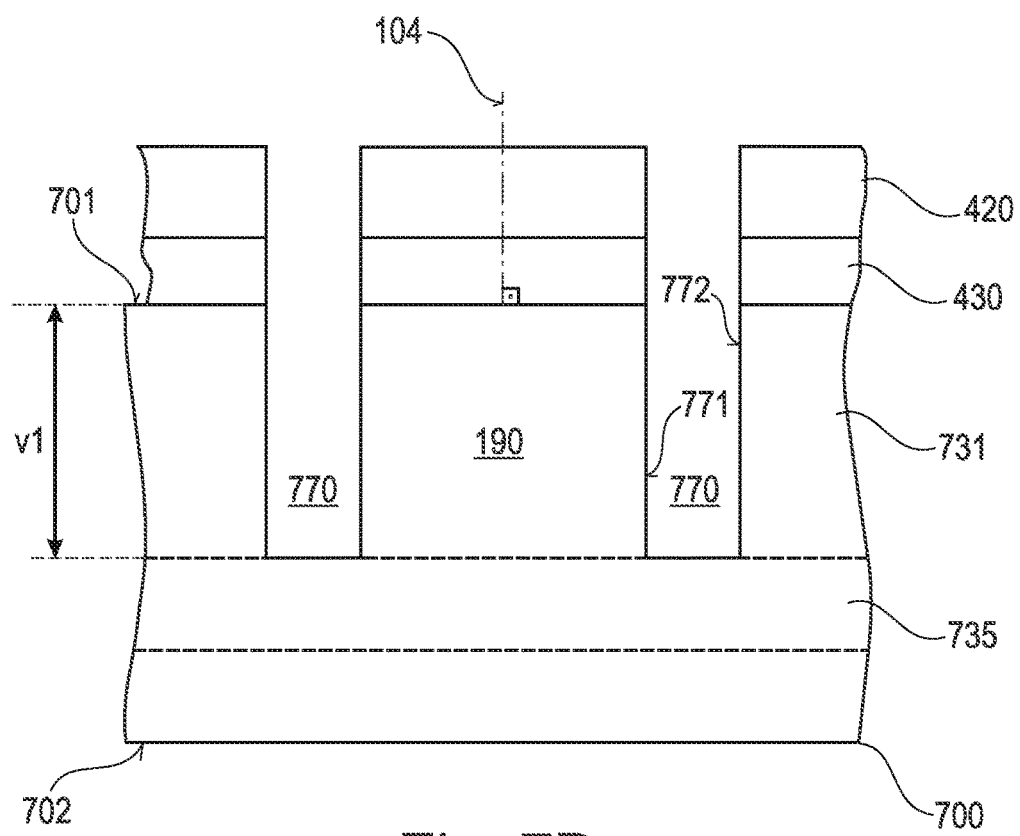

FIG. 7B shows the trenches 770 extending into the drift layer 730, e.g., into the main drift portion 731. The trenches 770 may expose the horizontal layer 735, wherein a vertical extension v1 of the trenches 770 may be at least 50% or at least 70% or may be even equal to the thickness of the main drift portion 731. The trenches 770 may have vertical or approximately vertical trench sidewalls 771, 772. For example, the trenches 770 may taper, wherein the first and second trench sidewalls 771, 772 may have a taper angle with respect to the vertical direction 104 of at most 10°. Portions of the silicon carbide substrate 700 laterally between neighboring trenches 770 form SiC portions 190.

Dopants of the second conductivity type are implanted through the bottom of the trenches 770 into the horizontal layer 735 or into a non-structured bottom part of the main drift portion 731 (latter one not shown in the drawings), wherein a mask stack including the implantation mask 430 and the second mask 420 is sufficiently thick to completely shield the SiC portions 190 against the implant. Implanting the dopants of the second conductivity type may include an implant process that forms a doped region with a comparatively uniform vertical dopant profile in silicon carbide (e.g., a vertical dopant profile with a uniformity that is higher than a threshold uniformity). For example, the implant process may include a high energy implant using an energy filter that flattens the energy distribution in the implant beam. Alternatively, the implant may use steadily varying implant energies and/or steadily varying implant angles.

Figure 7C:
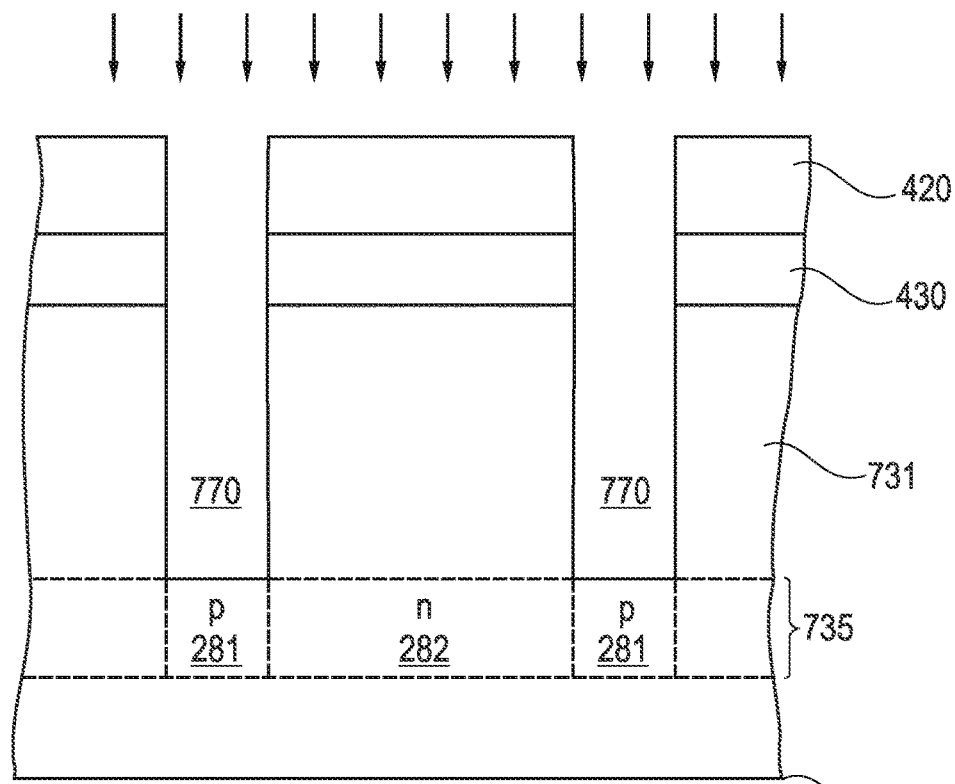

FIG. 7C shows first supplemental compensation regions 281 formed in the horizontal layer 735 below the trenches 770. Portions of the doped horizontal layer 735 between the first supplemental compensation regions 281 form second supplemental compensation regions 282. Parameters of the implant for forming the first supplemental compensation regions 281 are selected such that in a horizontal plane through the first and second supplemental compensation regions 281, 282 a desired degree of charge balance is achieved. For example, in each horizontal plane of the doped horizontal layer 735, a laterally integrated donor concentration across the compensation regions 282 deviates by not more than ±20% or better not more than (±10%, for example, by not more that ±5% from the laterally integrated acceptor concentration in the compensation regions 281.

The second mask 420 may be removed. One or more tilted implants, e.g., channeled implants as described above, may form first compensation layers 181 along the second trench sidewalls 772. The tilted implants may or may not use channeling.

Figure 7D:
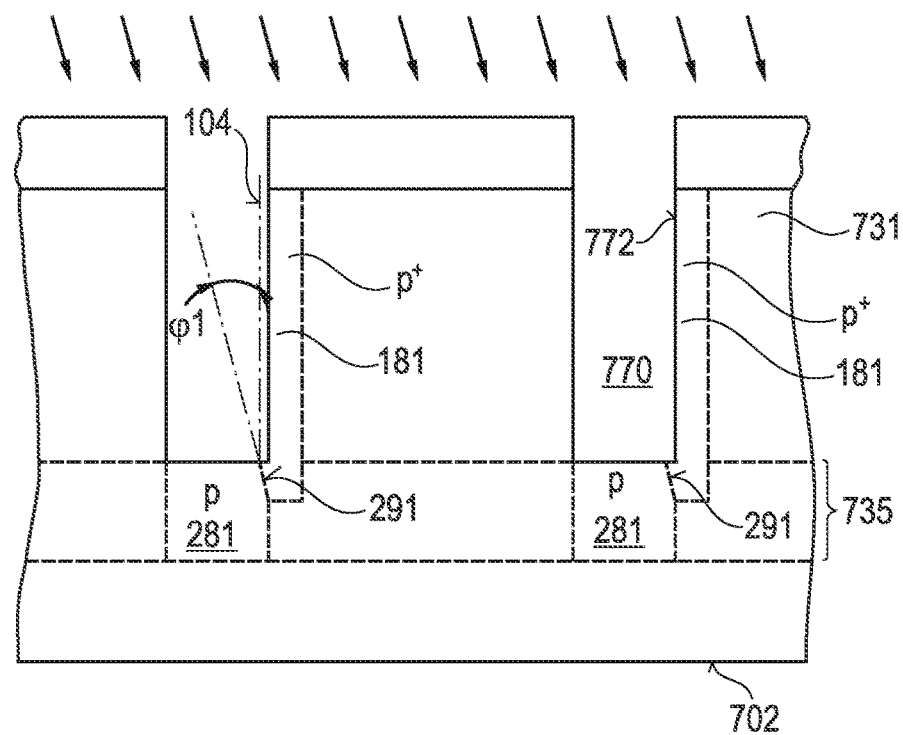

According to FIG. 7D the thickness of the implantation mask 430 is sufficiently thick to block the entrance of dopants through the main surface 701 into the silicon carbide substrate 700. Below the trenches 770, the first compensation layers 181 and the first supplemental compensation regions 281 of the doped horizontal layer 735 form first tilted junctions 291 that adjoin the trench bottom. A first tilt angle φ1 between the first tilted junctions 291 and a vertical direction 104 deviates by not more than ±5 degree from an angle between the vertical direction 104 and a lattice direction, along which channeling occurs.

One or more further tilted implants as described above may form first compensation layers 181 along the first trench sidewalls 771. The further tilted implant may be symmetric or asymmetric to the first tilted implants with respect to vertical center planes of the trenches 770, wherein the vertical center planes extend orthogonal to the cross-sectional plane. The first tilted implant and the further tilted implant may be symmetric to the vertical center planes (i.e., same angle size but different angle sign), e.g., when the <0001> lattice direction is not tilted to the vertical direction 104 or when the <0001> lattice direction is tilted to the vertical direction in a plane orthogonal to the cross-sectional plane. The first tilted implant and the further tilted implant may be asymmetric (i.e., different angle size and different angle sign), e.g., when the <0001> lattice direction is tilted to the vertical direction 104 in the cross-sectional plane. The implantation mask 430 may be removed.

Figure 7E:
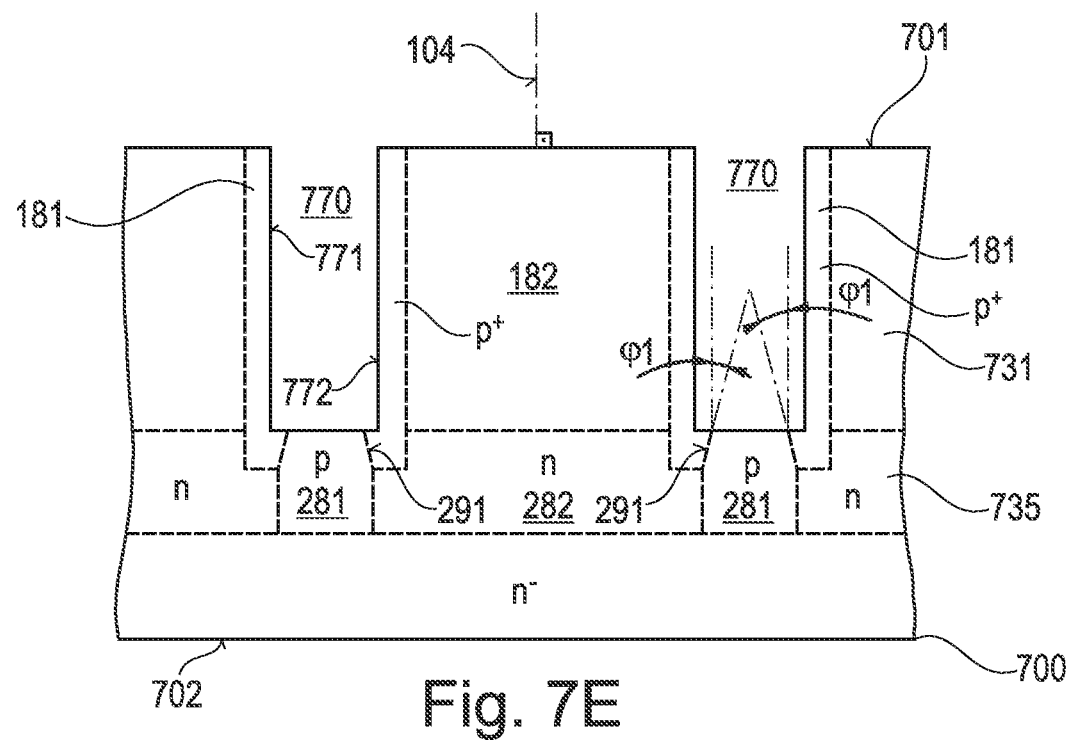
Figure 7F:
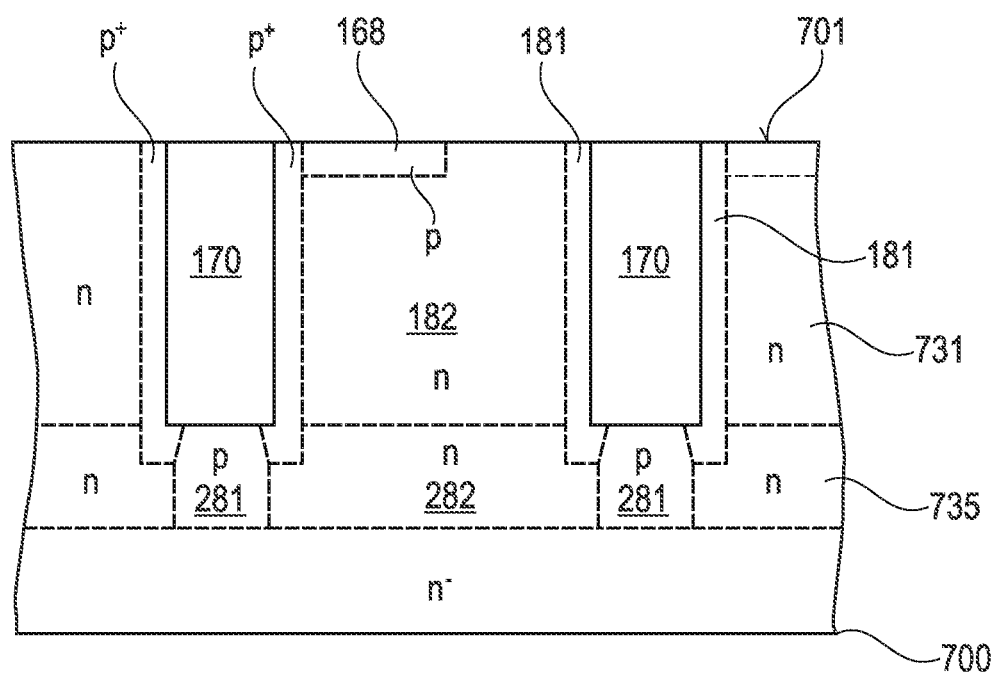

FIG. 7E shows first compensation layers 181 formed along the first and second trench sidewalls 771, 772. Below the trenches 770 the first compensation layers 181 and the horizontal layer 735 and/or the first compensation layers 181 and a non-structured bottom part of the main drift portion 731 may form first tilted junctions 291. The first tilted junctions 291 may extend from the trench bottom into direction of a rear side surface 702 of the silicon carbide substrate 700, wherein the rear side surface 702 is opposite to the main surface 701. The first tilt angle φ1 between the vertical extension 104 and the first tilted junctions 291 may be greater than the implant angle. The two first tilted junctions 291 below the trench bottom may be symmetric with respect to the vertical extension 104 or the first tilt angles φ1 may be asymmetric with respect to the vertical center plane of the trench 770. For example, the first tilt angles φ1 below the two trench sidewalls 771, 772 may be symmetric with respect to the <0001> lattice direction.

The trenches 770 are filled. First dopants are implanted through the main surface 701 to form deep shielding portions 168 in the main drift layer 731.

FIG. 7E shows fill structures 170 completely filling the trenches 770 illustrated in FIG. 7E. The fill structures 170 may include an insulator material. For example, the fill structures 170 may be completely formed from silicon oxide or may include at least one dielectric material different from silicon oxide, wherein a total temperature coefficient of the fill structure 170 may be closer to the temperature coefficient of single-crystalline silicon carbide than the temperature coefficient of silicon oxide. For example, the fill structures 170 may include silicon nitride and/or a silicon oxide, for example, a silicon oxide formed by using TEOS (tetraethylorthosilane) as precursor material, a HDP (high density plasma) silicon oxide, and/or an oxide densified after deposition. According to a further example, the fill structures 170 may include or consist of doped or undoped crystalline silicon carbide. For example, a first vertical section of the fill structures 170 may include or consist of silicon carbide and a second vertical section of the fill structures 170 may include or consist of dielectric material. The second vertical section may be between the first vertical section and the main surface 701.

The deep shielding portions 168 extend along the main surface 701. Each deep shielding portion 168 laterally adjoins to or overlaps with one of the first compensation layers 181.

An epitaxial top layer 790 may be formed on the main surface 701 of the silicon carbide substrate 700 of FIG. 7E. Doped regions may be formed in the epitaxial top layer 790. Forming the doped regions may include ion implantation.

Figure 7G:
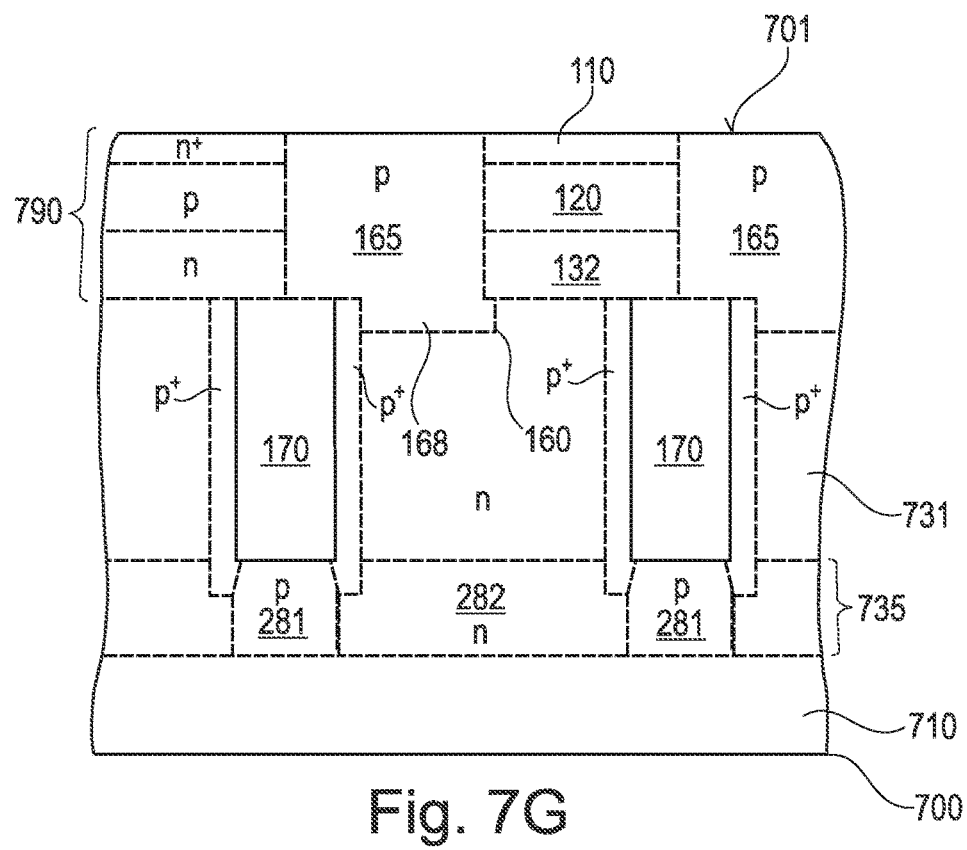

FIG. 7G shows the epitaxial top layer 790. After epitaxy, the exposed top surface of the epitaxial top layer 790 forms the main surface 701 of the silicon carbide substrate 700. In the epitaxial top layer 790, main shielding portions 165 extend from the main surface 701 down to the deep shielding portions 168. Each pair of main shielding portion 165 and deep shielding portion 168 forms one contiguous shielding region 160. Between neighboring shielding regions 160, the epitaxial top layer 790 includes source regions 110 of the first conductivity type, body regions 120 of the second conductivity type and current spread regions 132 of the first conductivity type. The source regions 110 are formed along the main surface 701. The current spread regions 132 are formed along the main drift layer 731. Each body region 120 is laterally in contact with a shielding region 160 and vertically separates a source region 110 and a current spread region 132.

Gate trenches may be etched from the main surface 701 into the silicon carbide substrate 700, wherein the gate trenches may be stripe-shaped or needle-shaped. Needle-shaped gate trenches have two orthogonal lateral dimensions within the same order of magnitude. Needle-shaped gate trenches may be combined with needle-shaped fill structures 170. Stripe-shaped gate structures may be combined with needle-shaped fill structures 170. Alternatively, stripe-shaped gate structures may be combined with stripe-shaped fill structures 170, wherein horizontal longitudinal axes of stripe-shaped gate structures 150 may be parallel to horizontal longitudinal axes of the fill structures 170 or may be tilted to the horizontal longitudinal axes of the fill structures 170. For example, the horizontal longitudinal axes of the stripe-shaped gate structures 150 may run orthogonal to the horizontal longitudinal axes of the fill structures 170.

A gate dielectric 159 may be formed that lines the gate trenches. Conductive material may be deposited to form gate electrodes 155 in the gate trenches.

Figure 7H:
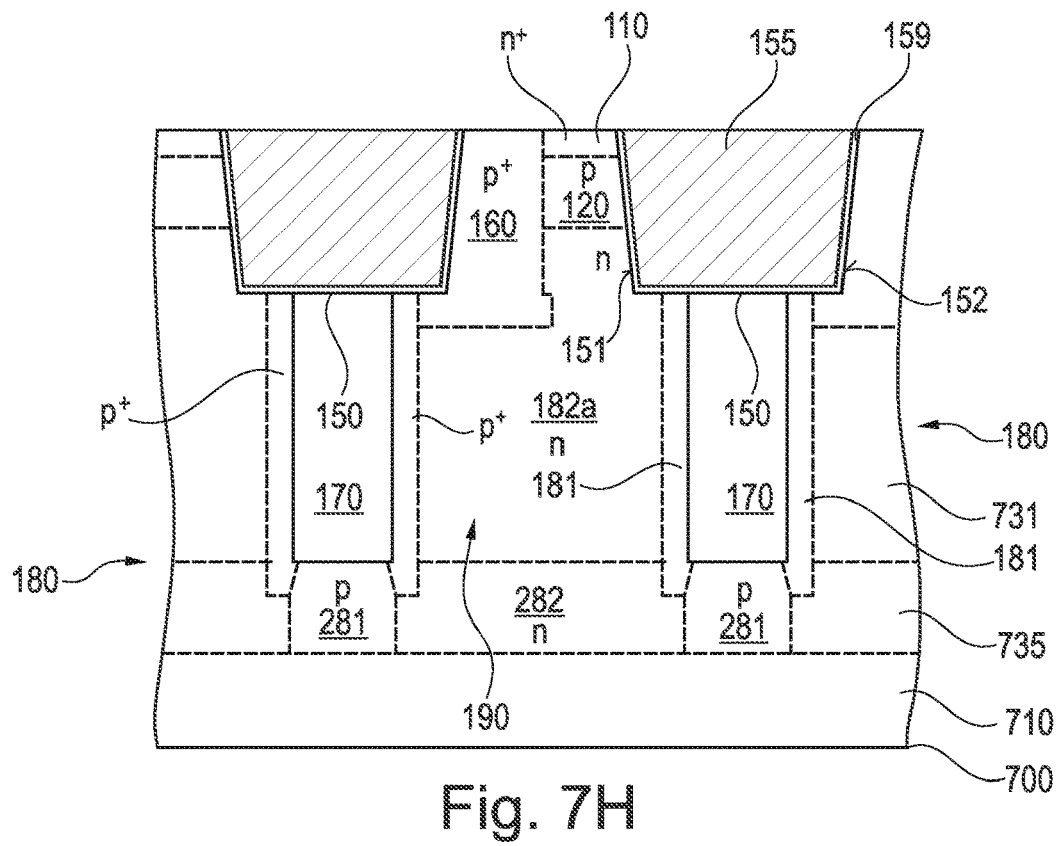

FIG. 7H shows stripe-shaped gate structures 150 and stripe-shaped fill structures 170 having longitudinal axes running orthogonal to the cross-sectional plane. The gate structures 150 are formed above (e.g., directly above) the fill structures 170. The gate structures 150 include the gate electrode 155 and the gate dielectric 159 between the gate electrode 155 and the silicon carbide substrate 700. For example, the gate dielectric 159 may completely separate the gate electrode 155 and the silicon carbide substrate 700.

The body regions 120 are in contact with active first gate sidewalls 151 of the gate structures 150. The shielding regions 160 are in contact with opposite inactive second gate sidewalls 152 of the gate structure 150. In the on-state of a silicon carbide device obtained from the silicon carbide substrate 700, an inversion channel is formed along the gate dielectric 159 through the body region 120. The inversion channel may be formed parallel to a lattice direction with high charge carrier mobility (e.g., a charge carrier mobility higher than a threshold charge carrier mobility), for example, the <11-20> plane. The deep shielding portion 168 connects the first compensation layer 181 and the main shielding portion 165.

A compensation structure 180 between the gate structures 150 and the base portion 710 includes a first vertical section in the main drift portion 731 and a second vertical section in the horizontal layer 735. The first vertical portion includes p-type columns including the first compensation layers 181 and n-type columns including the second compensation portion 182a in the SiC portions 190 between neighboring fill structures 170. The second vertical portion includes, as p-type columns, first supplemental compensation regions 281 below (e.g., directly below) the fill structures 170 and, as n-type columns, second supplemental compensation regions 282 below (e.g., directly below) the second compensation portions 182a in the main drift portion 731.

FIGS. 8A to 8F illustrate an embodiment concerning transistor cells with one-sided channel, wherein gate structures are formed in trenches that are used for tilted implants for forming a compensation structure.

Implants through the main surface 701 of a silicon carbide substrate 700 with a drift layer 730 and a base portion 710 as described with reference to FIG. 7A form shielding regions 160 and source regions 110 and define body regions 120.

Figure 8A:
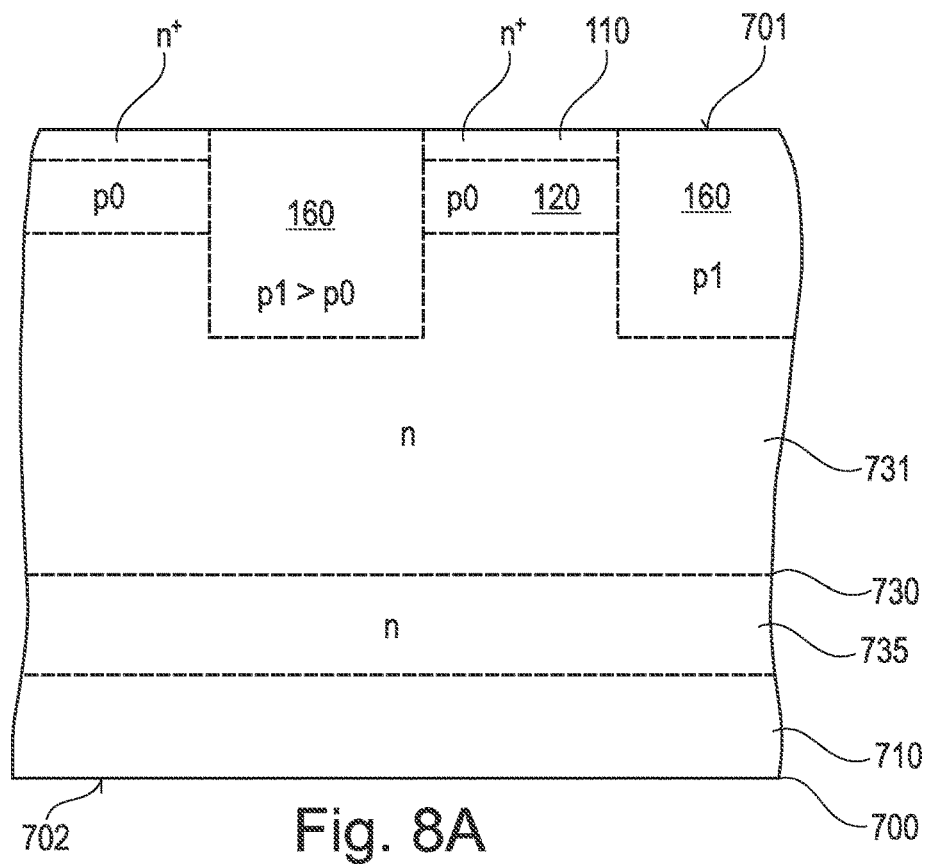
FIGS. 8A-8F show schematic vertical cross-sectional views of a portion of a silicon carbide substrate for illustrating a method of manufacturing a SiC SJ-TMOSFET according to an embodiment with a gate electrode and a fill structure formed in the same trench.

FIG. 8A shows p doped shielding regions 160 extending from the main surface 701 into the silicon carbide substrate 700. The shielding regions 160 may be stripe-shaped with horizontal longitudinal axes orthogonal to the cross-sectional plane. The shielding regions 160 may form a regular stripe pattern with stripes of equal width and at equal distances. Between the shielding regions 160, n doped source regions 110 extend along the main surface 701. P doped body regions 120 extend from one neighboring shielding region 160 to a neighboring shielding region 160, wherein each body region 120 may separate a source region 110 from a main drift portion 731. A vertical extension of the shielding regions 160 may be greater than a distance between the main surface 701 and the edge of the body regions 120 oriented to the rear side surface 702. A maximum dopant concentration in the shielding regions 160 may be higher than a maximum dopant concentration in the body regions 120.

A mask stack may be formed on the main surface 701 as described with reference to FIG. 7A. Trenches 770 are formed as described with reference to FIG. 7B, wherein first trench sidewalls 771 laterally expose the body regions 120 and the source regions 110, and wherein second trench sidewalls 772 laterally expose the shielding regions 160. N doped first compensation layers 181, p doped first supplementary compensation regions 281 and n doped second supplementary compensation regions 282 of a compensation structure 180 are formed as described with reference to FIGS. 7C to 7E, wherein formation of the first compensation layer 181 may include a channeled implant.

Figure 8B:
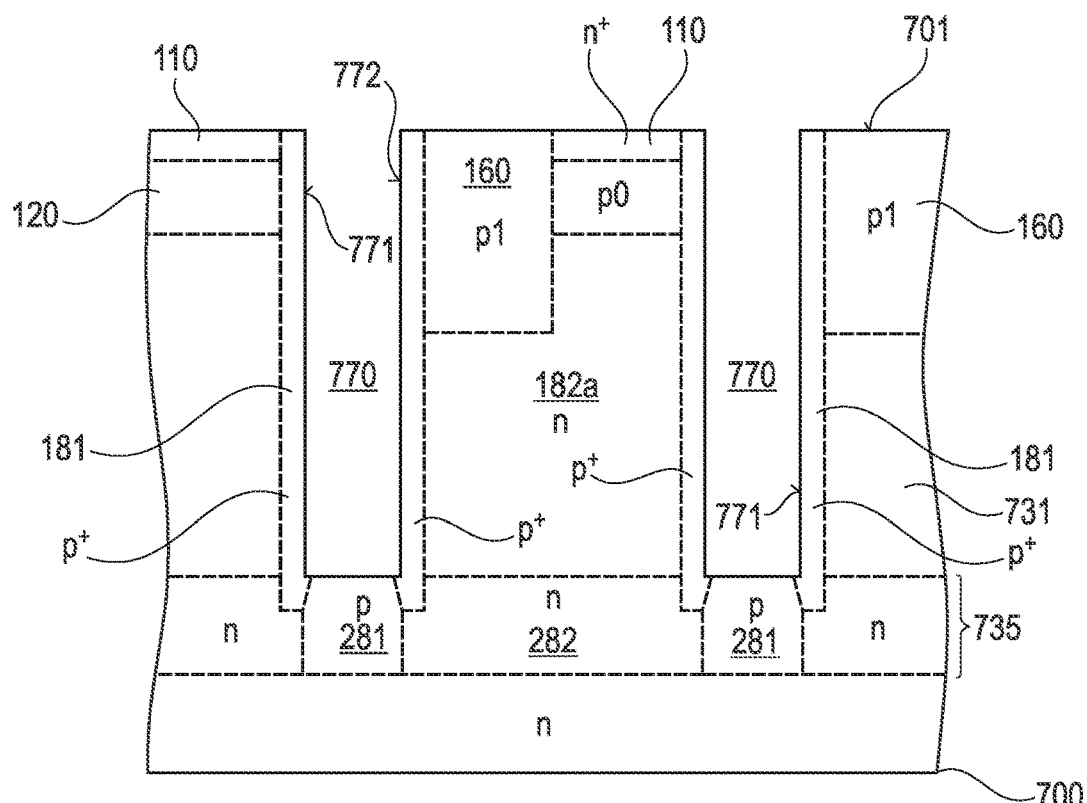

FIG. 8B shows the trenches 770 extending from the main surface 701 down to the horizontal layer 735 or down to a non-structured bottom part of the main drift portion 731. The compensation structure 180 includes the first compensation layers 181, second compensation portions 182a, the first supplementary compensation regions 281 and the second supplementary compensation regions 282 as described with reference to FIG. 7E. First compensation layers 181 along the first trench sidewalls 771 are in contact with the source regions 110, the body regions 120, and the first supplementary compensation regions 281. First compensation layers 181 along the second trench sidewalls 772 are in contact with the shielding regions 160 and with the first supplementary compensation regions 281.

A fill structure 170 may be formed in a bottom portion of the trenches 770. Forming the fill structure 170 may include epitaxial growth and/or deposition of one or more fill materials and/or fill layers.

Figure 8C:
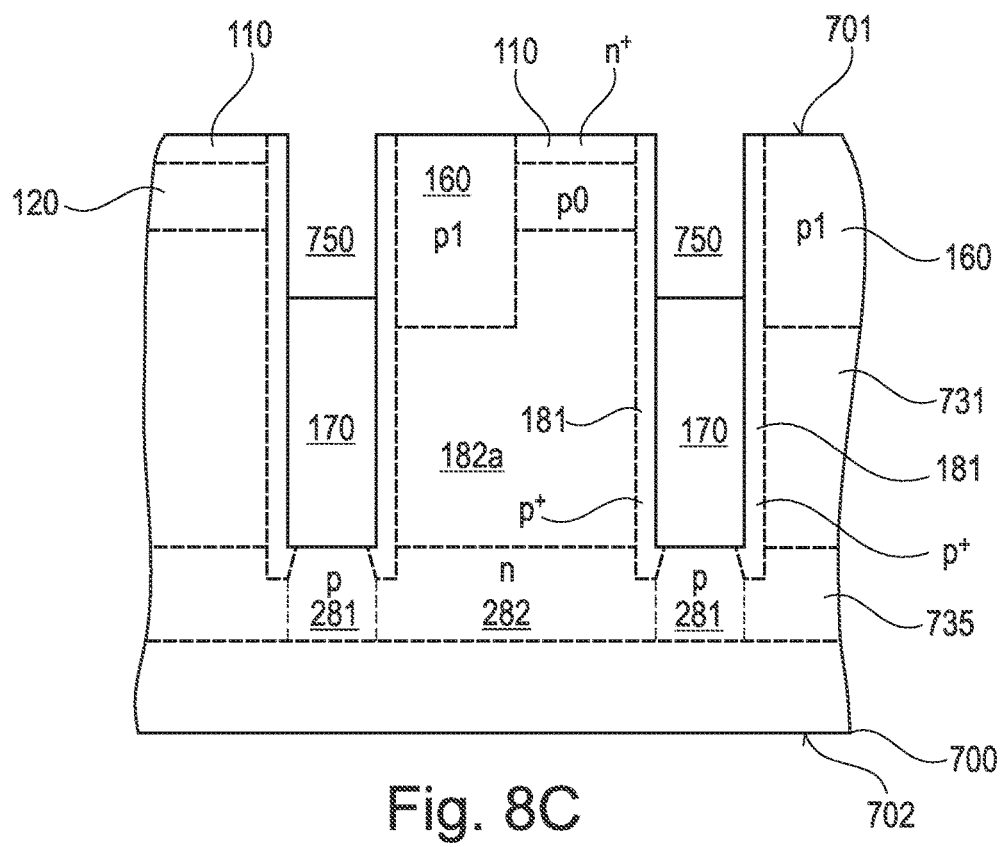

FIG. 8C shows the fill structures 170 filling the bottom portion of the trenches 770 of FIG. 8B. Top portions of the trenches 770 of FIG. 8B form gate trenches 750. The gate trenches 750 may be re-shaped. The re-shaping may include a removal or a modification of portions of the first compensation layers 181 between the main surface 701 and the fill structure 170.

Figure 8D:
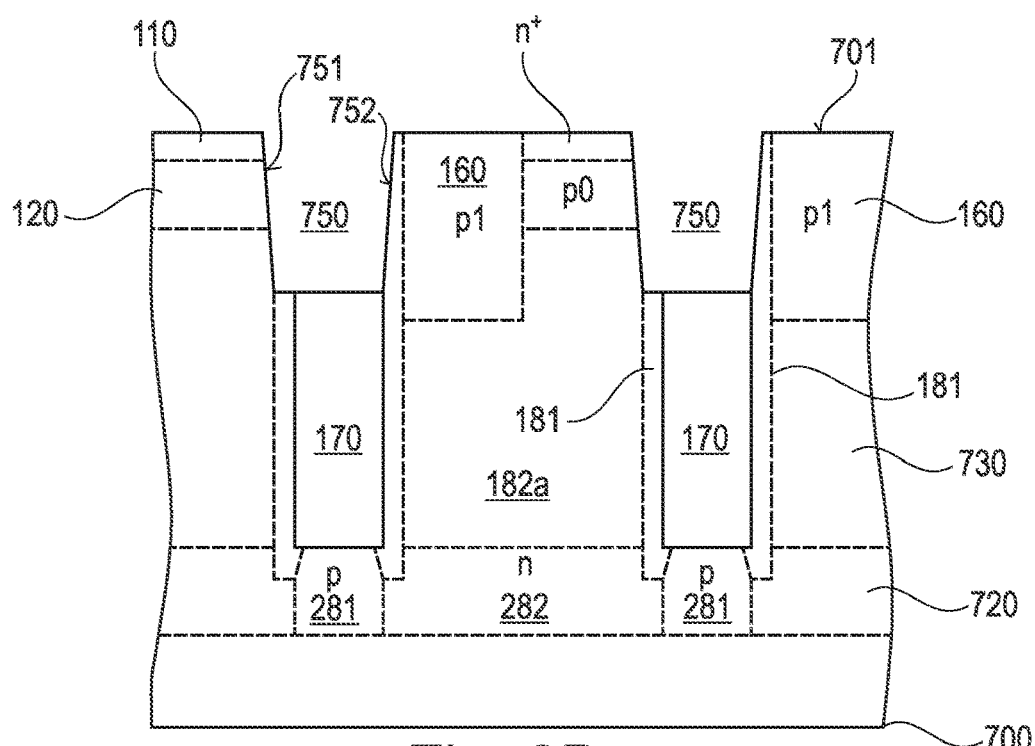

FIG. 8D shows the re-shaped gate trenches 750. The re-shaped gate trenches 750 may taper with increasing distance to the main surface 701. First gate trench sidewalls 751 of the gate trenches 750 laterally expose the body regions 120, the source regions 110 and the main drift portion 731. Second gate trench sidewalls 752 of the gate trenches 750 laterally expose the shielding regions 160 and/or the first compensation layers 181. A vertical extension of the gate trenches 750 is smaller than a vertical extension of the shielding regions 160 and greater than a distance between a lower edge of the body regions 120 and the main surface 710.

A gate dielectric 159 may be formed at least along the first gate trench sidewalls 751 of the gate trench 750. Formation of the gate dielectric 159 may include an oxidation process and/or deposition process.

Figure 8E:
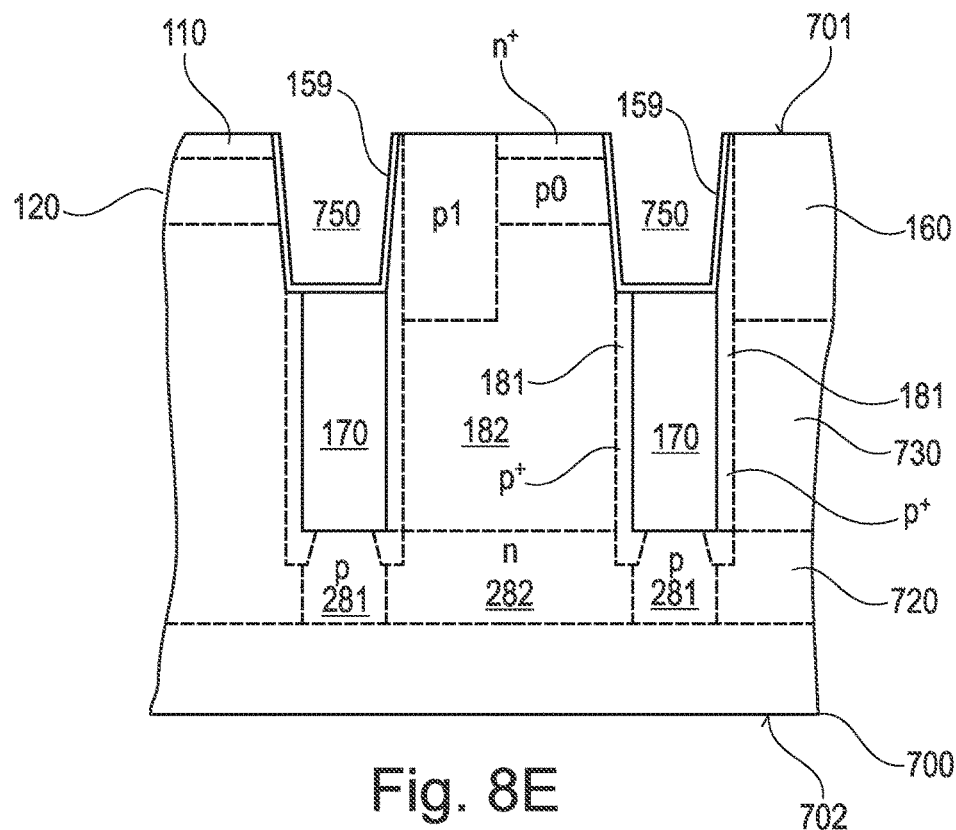

FIG. 8E shows a gate dielectric 159 formed at least partly by a deposition process or formed exclusively by thermal oxidation, wherein the fill structure 170 includes silicon carbide. Conductive material may be deposited in the gate trenches 750.

Figure 8F:
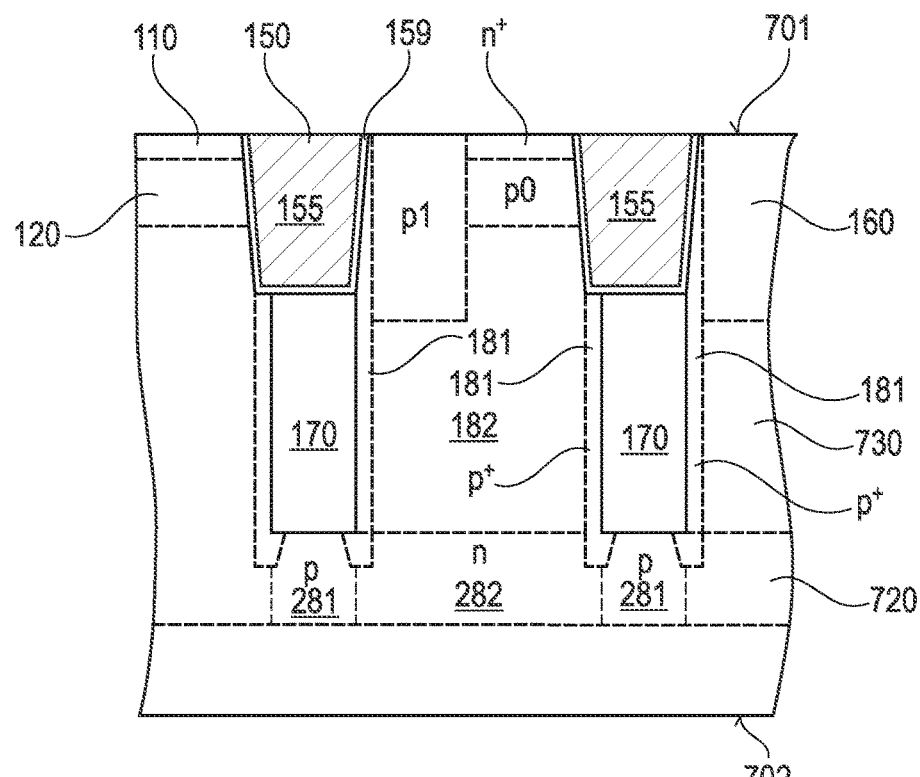

FIG. 8F shows gate electrodes 155 formed by residuals of the deposited conductive material in the gate trenches 750 of FIG. 8E. The gate electrodes 155 may include doped polycrystalline silicon, by way of example.

Figure 9A:
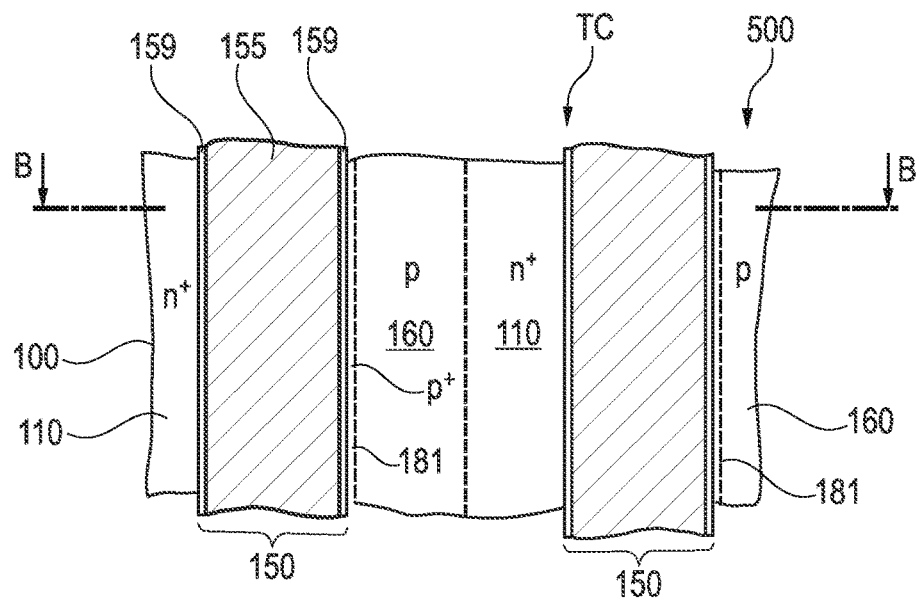
FIGS. 9A-9B are schematic horizontal and vertical cross-sectional views of a portion of a SiC SJ-TMOSFET with one-sided channel according to an embodiment.
Figure 9B:
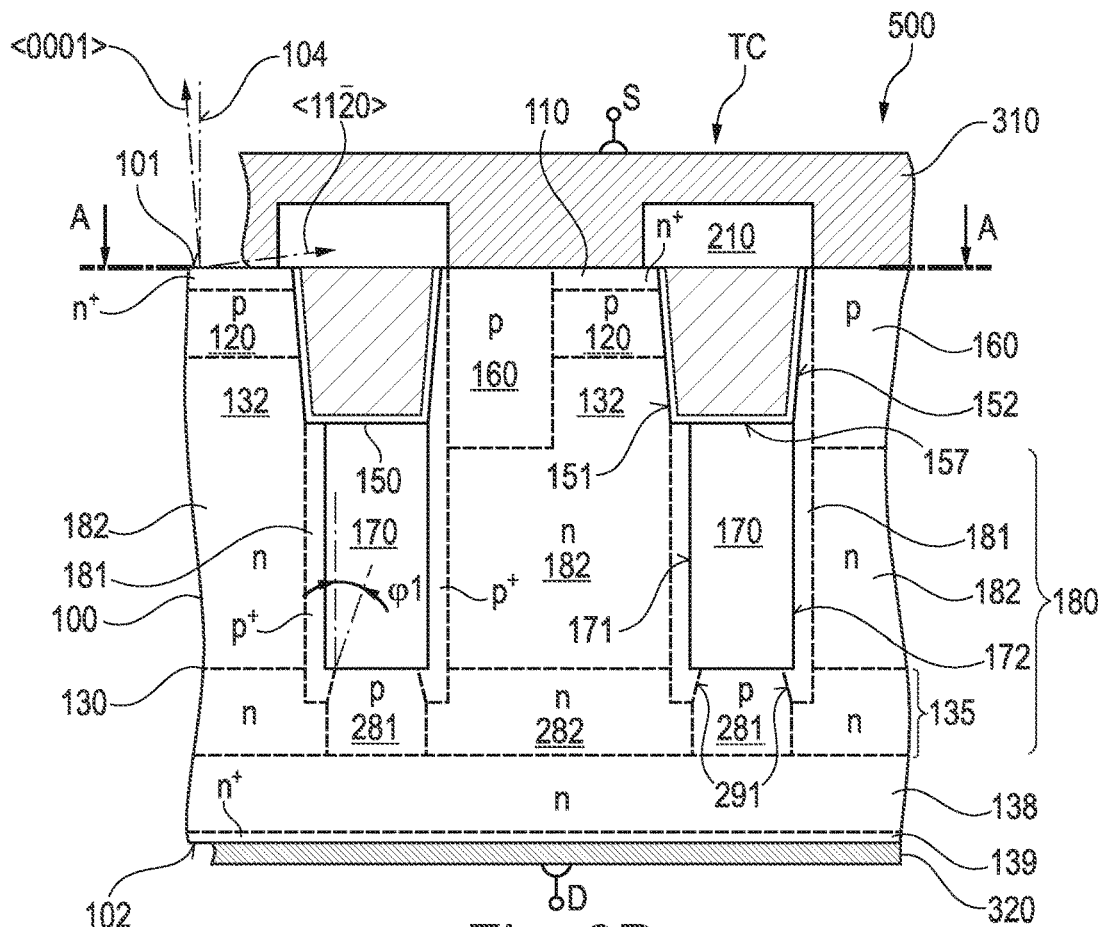

FIGS. 9A and 9B show a silicon carbide device 500 including transistor cells TC and a compensation structure 180. The silicon carbide device 500 includes a silicon carbide body 100 that may be formed from a portion of a semiconductor substrate 700 as described above in connection with FIGS. 1A-1C, FIGS. 2A-2C, FIG. 3, FIG. 4, FIGS. 5A-5C, FIGS. 7A-7H, or FIGS. 8A-8F, wherein a portion of the main surface 701 of the semiconductor substrate 700 forms a first surface 101 at a front side of the silicon carbide body 100. The first surface 101 and a second surface 102 of the silicon carbide body 100 at a rear side of the silicon carbide body 100 are parallel to each other. A thickness of the silicon carbide body 100 is given along a vertical direction 104.

The transistor cells TC are formed along stripe-shaped trench gate structures 150 that extend from the first surface 101 into the silicon carbide body 100. The gate structures 150 may be long stripes extending along a lateral longitudinal direction through an active region of the silicon carbide device 500. In other embodiments, lateral cross-sections of the gate structures 150 may, e.g., be hexagonal or quadratic.

The gate structures 150 include a conductive gate electrode 155 that may include or consist of a heavily doped polycrystalline silicon layer and/or a metal-containing layer. A gate dielectric 159 separates the gate electrode 155 from the silicon carbide body 100 along at least one side of the gate structure 150. The gate dielectric 159 may include or consist of thermally grown or deposited silicon oxide, silicon nitride, silicon oxynitride, another deposited dielectric material or any combination thereof. A thickness of the gate dielectric 159 may be selected to obtain transistor cells TC with a threshold voltage in a range from 1.0 V to 8 V. The gate structures 150 may exclusively include the gate electrode 155 and the gate dielectric 159 or may include further conductive and/or dielectric structures in addition to the gate electrode 155 and the gate dielectric 159.

The gate structures 150 are stripe-shaped. That is to say: a length of the gate structures 150 along the lateral first direction is greater than a width of the gate structures 150 along a lateral second direction orthogonal to the first direction.

The gate structures 150 may be equally spaced, may have equal width, and may form a regular stripe pattern, wherein a center-to-center distance between the gate structures 150 may be in a range from 1 µm to 10 µm, e.g., from 2 µm to 5 µm. A length of the gate structures 150 may be up to several millimeters. A vertical extension of the gate structures 150 may be in a range from 0.3 µm to 5 µm, e.g., in a range from 0.5 µm to 2 µm. At the bottom, the gate structures 150 may be rounded.

Opposing first and second gate sidewalls 151, 152 of each of the gate structures 150 may run essentially along the vertical direction 104 or may be tilted with respect to the vertical direction 104 by a taper angle. In the latter case, the gate structures 150 may taper with increasing distance to the first surface 101. The taper angle between the gate sidewalls 151, 152 and the vertical direction 104 at the first surface 101 may be chosen according to the alignment of the crystal axes and/or according to the off-axis angle.

For example, the absolute value of the taper angle between the first gate sidewall 151 and the vertical direction 104 may deviate from the absolute value of the off-axis angle by not more than ±1° (e.g., in the case of 4H—SiC the taper angle may range from at least 3° to at most 5°). The taper angle may, however, deviate from the off-axis angle in orientation. The taper angle between the second gate sidewall 152, which is opposite to the first gate sidewall 151, and the vertical direction may be oriented opposite to the taper angle of the first sidewall 151. The larger the taper angle, the narrower the gate structure 150 becomes starting from the first surface 101.

In some examples, at least the first gate sidewall 151 may run essentially along a crystal plane of the silicon carbide body 100 in which charge carrier mobility is high (e.g., higher than a threshold charge carrier mobility), such as one of the {11-20} or the {1-100} crystal planes. The first gate sidewall 151 may be an active sidewall, that is to say, the channel region may run along the first gate sidewall 151. In some embodiments, the second gate sidewall 152 may also be an active sidewall (e.g., in the case of a vertical trench gate structure 150). In other embodiments, (e.g., in case of a tapering trench gate structure 150) the second gate sidewall 152 may be an inactive sidewall.

The silicon carbide body 100 may include a doped drift structure 130, wherein the drift structure 130 is formed between the gate structures 150 and the second surface 102 of the silicon carbide body 100. The drift structure 130 includes first compensation layers 181, second compensation regions 182, fill structures 170, a doped horizontal layer 135 and a heavily doped contact portion 139. The contact portion 139 is formed between the horizontal layer 135 and the second surface 102. The doped horizontal layer 135 is formed between the fill structures 170 and the contact portion 139.

The contact portion 139 has the first conductivity type and may be or may include a substrate portion obtained from a crystalline ingot and/or may include a heavily doped portion of a layer formed by epitaxy. Along the second surface 102, a dopant concentration in the contact portion 139 is sufficiently high (e.g., the dopant concentration is higher than a threshold dopant concentration) to ensure a low-resistive ohmic contact between the contact portion 139 and a second load electrode 320.

The horizontal layer 135, the first compensation layers 181 and the second compensation regions 182a may be formed in a layer grown by epitaxy. The horizontal layer 135 may include doped regions of both conductivity types. The doped regions of the doped horizontal layer 135 may include first supplemental compensation regions 281 of the second conductivity type and second supplemental compensation regions 282 of the first conductivity type. The oppositely doped regions may form n-type column sections and p-type column sections of a compensation structure 180.

The horizontal layer 135 may adjoin (e.g., directly adjoin) the contact portion 139. Alternatively, a spacer layer 138 may separate the horizontal layer 135 and the contact portion 139. The spacer layer 138 has the first conductivity type and may include a lightly doped drift layer and/or a more heavily doped buffer layer and/or a more heavily doped drain layer, wherein a vertical extension of the buffer layer 138 may be approximately 1 µm and wherein a mean dopant concentration in the buffer layer 138 may be in a range from $3 \times 10^{17}$ cm$^{-3}$ to $5 \times 10^{18}$ cm$^{-3}$, by way of example.

The fill structures 170 may be formed below (e.g., directly below) the gate structures 150. A gate bottom surface 157 of the gate structures 150 may be in contact (e.g., in direct contact) with a top surface of at least one of the fill structures 150. The fill structures 170 may have vertical or approximately vertical first and second sidewalls 171, 172. The fill structures 170 may be homogenous structures or may be layered structures including two or more sublayers from different materials. The fill structures 170 may exclusively include dielectric materials, wherein the gate electrode 155 may be in contact (e.g., in direct contact) with the fill structure 170. Alternatively, the fill structures 170 exclusively include undoped or doped semiconductor material, e.g., single-crystalline SiC, or include at least one undoped semiconductor material and at least one dielectric material.

The first compensation layers 181 have the second conductivity type and extend at uniform thickness along and parallel to the first and second sidewalls 171, 172 of the fill structures 170. The second compensation regions 182 are portions of an in-situ doped epitaxial grown layer of the first conductivity type. Each second compensation region 182 is formed between two neighboring first compensation layers 181. A second compensation region 182 and the neighboring first compensation layers 181 form vertical or approximately vertical pn junctions. The first compensation layers 181 may form p-doped column sections and the second compensation regions 182 may form n-doped column sections of the compensation structure 180, wherein in the blocking mode of the semiconductor device 500 the charge in the p-doped columns and the charge in the n-doped columns are balanced to a predetermined degree.

The first supplemental compensation region 281 may be formed below (e.g., directly below) one of the fill structures 170 and may adjoin (e.g., directly adjoin) both first compensation layers 181 formed along the first and second sidewalls 171, 172 of the fill structure 170. The first supplemental compensation regions 281 and the first compensation layers 181 may have the same dopant concentration or may form unipolar junctions.

The first supplemental compensation regions 281 and the first compensation layers 181 may form first tilted junctions 291 with a first tilt angle φ1 between the first tilted junctions 291 and the vertical direction 104.

Each second supplemental compensation region 282 may be formed below (e.g., directly below) one of the second compensation regions 182 and may adjoin (e.g., directly adjoin) the second compensation region 182. The second supplemental compensation regions 282 and the second compensation regions 182 may have the same dopant concentration or may form unipolar junctions.

A portion of the silicon carbide body 100 laterally between two neighboring gate structures 150 includes a source region 110 of the first conductivity type, a body region 120 of the second conductivity type, a current spread region 132 of the first conductivity type and at least a portion of a shielding region 160 of the second conductivity type.

The source region 110 is between the first surface 101 and the body region 120. The body region 120 separates the source region 110 and the current spread region 132. The body region 120 and the current spread region 132 form a pn junction. The body region 120 and the source region 110 form a pn junction.

The current spread region 132 adjoins (e.g., directly adjoins) the second compensation region 182a. The current spread region 132 and the second compensation region 182a may have a same dopant concentration or may form a unipolar junction.

The body region 120 and the source region 110 adjoin (e.g., directly adjoin) the active first sidewall 151 of a first gate structure 150. A vertical extension of the body region 120 corresponds to a channel length of the transistor cells TC and may be in a range from 0.2 μm to 1.5 μm. Along the lateral direction orthogonal to the cross-sectional plane, the source region 110 may extend without interruptions along the complete lateral length of the first gate structure 150.

The shielding region 160 is formed between the body region 120 and the inactive second sidewall 152 of a neighboring second gate structure 150 and extends along the inactive second sidewall 152 of the second gate structure 150 from the first surface 101 into the silicon carbide body 100. A vertical extension of the shielding region 160 is greater than a vertical extension of the gate structures 150. The shielding region 160 is in contact (e.g., in direct contact) with the first compensation layer 181 formed along the second sidewall 172 of the fill structure 170.

A maximum dopant concentration in the shielding region 160 may be higher than a maximum dopant concentration in the body region 120. A vertical dopant concentration profile in the shielding region 160 may have a local maximum at a position below the trench gate structure 150. Along the inactive second sidewall 152 a dopant concentration in the shielding region 160 may be higher, i.e., at least two times or at least five times or even at least ten times higher than a dopant concentration in the body region 120 along the active first sidewall 151. Along the lateral direction orthogonal to the cross-sectional plane, the shielding region 160 may extend without interruptions along the complete horizontal length of the gate structure 150. The shielding region 160 and the adjoining second compensation region 182a form a pn junction.

The compensation structure 180 includes a first vertical section and a second vertical section. The first vertical portion includes p-type columns including the first compensation layers 181 and n-type columns including the compensation regions 182. The second vertical portion includes the first supplemental compensation regions 281 as p-type columns, and the second supplemental compensation regions 282 as n-type columns.

A first load electrode 310 at the front side of the silicon carbide body 100 is electrically connected with the source regions 110, the body regions 120, and the shielding regions 160. The gate electrode 155 may be electrically connected to a gate metallization at the front side of the silicon carbide body 100. The gate metallization forms or that is electrically connected or coupled to a gate terminal.

Stripe-shaped portions of an interlayer dielectric 210 separate the first load electrode 310 and the gate electrode 155 in the gate structures 150. The first load electrode 310 may form or may be electrically connected with or coupled to a first load terminal, which may be an anode terminal of an MCD or a source terminal of an MOSFET.

The second load electrode 320, which forms a low-resistive ohmic contact with the contact portion 139, may form or may be electrically connected with or coupled to a second load terminal, which may be a cathode terminal of an MCD or a drain terminal of an MOSFET.

The illustrated silicon carbide device 500 is an n-channel SiC-TMOSFET, wherein the first load electrode 310 forms or is electrically connected or coupled to a source terminal S and wherein the second load electrode 320 forms or is electrically connected or coupled to a drain terminal D. The silicon carbide device 500 includes a plurality of transistor cells TC and a plurality of gate structures 150 as illustrated in FIG. 9A-9B, wherein the transistor cells TC are electrically connected in parallel.

Figure 10A:
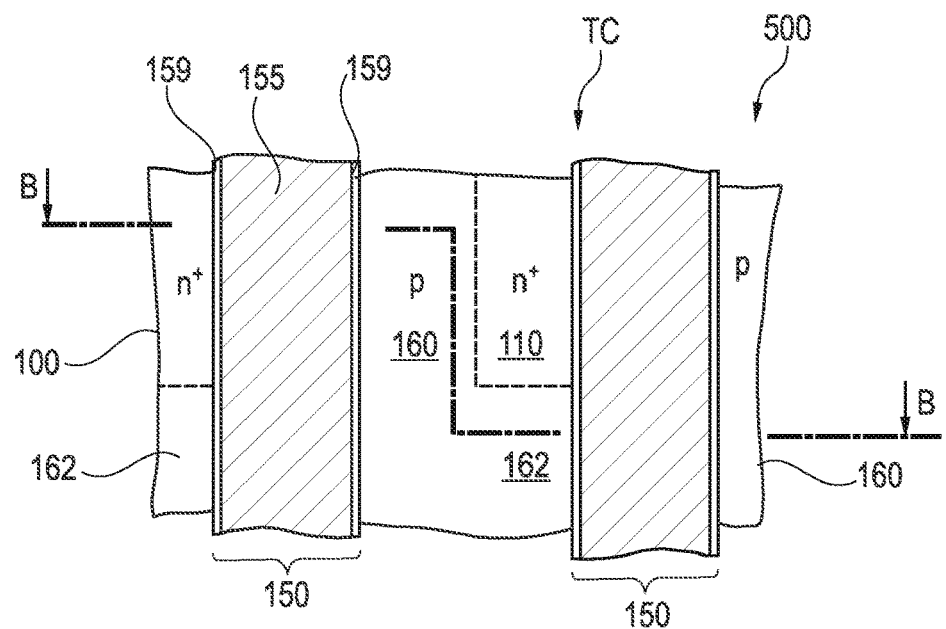
FIGS. 10A-10B are schematic horizontal and vertical cross-sectional views of a portion of a SiC SJ-TMOSFET with one-sided channel according to an embodiment.
Figure 10B:
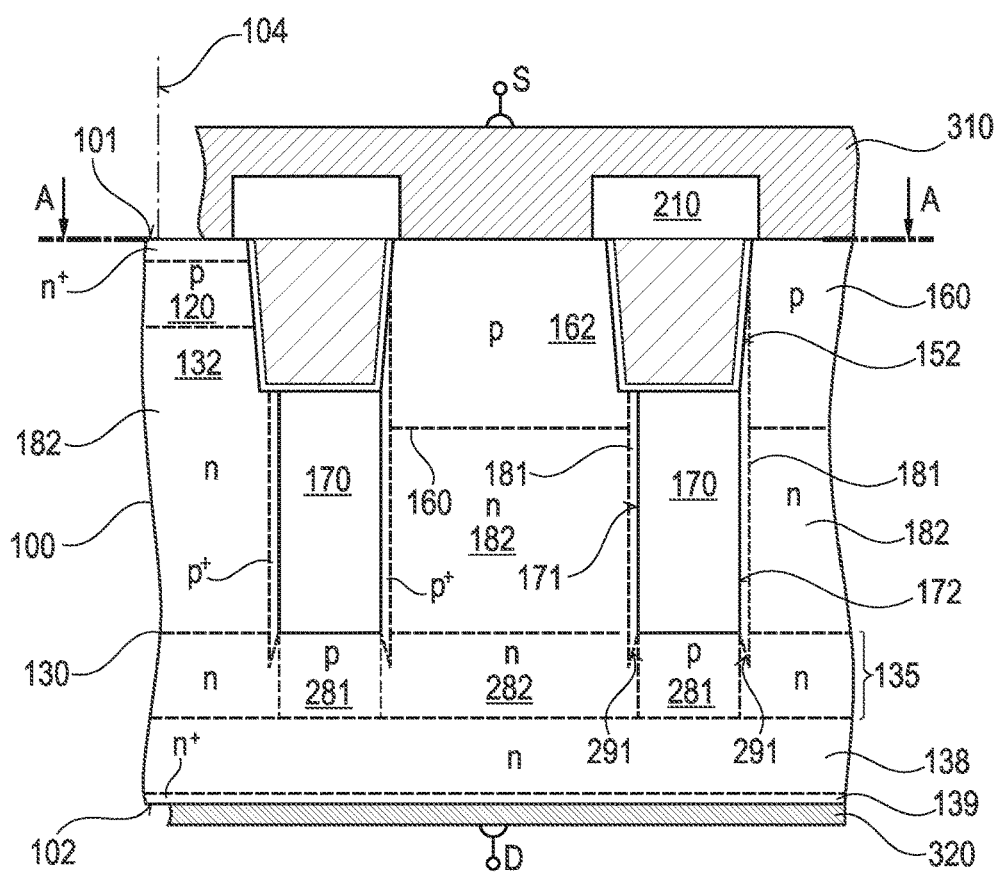

In FIGS. 10A-10B the shielding regions 160 include lateral shielding extension portions 162 that interrupt the source regions 110 along the lateral first direction parallel to the stripe-shaped gate structures 150. The lateral shielding extension portions 162 connect (e.g., directly connect) the first compensation layers 181, which are formed at the side of the first gate sidewalls 151, with the first load electrode 310 and improve the shielding of the gate dielectric 159 along the active first gate sidewalls 151. The fill structures 170 are formed from undoped or doped single crystalline SiC. The first compensation layer 181 and the second supplemental compensation regions 282 form first tilted junctions 291, which may include pn junctions.

Figure 11A:
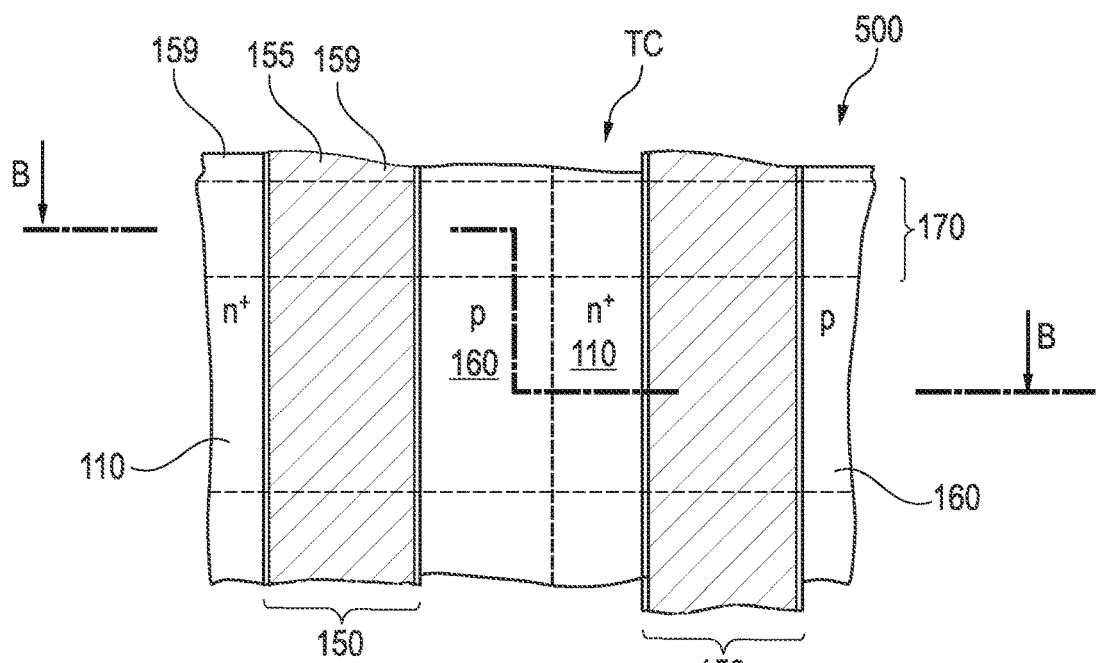
FIGS. 11A-11B are schematic horizontal and vertical cross-sectional views of a portion of a SiC SJ-TMOSFET with one-sided channel according to an embodiment with the compensation structure oriented orthogonal to the gate structures.
Figure 11B:
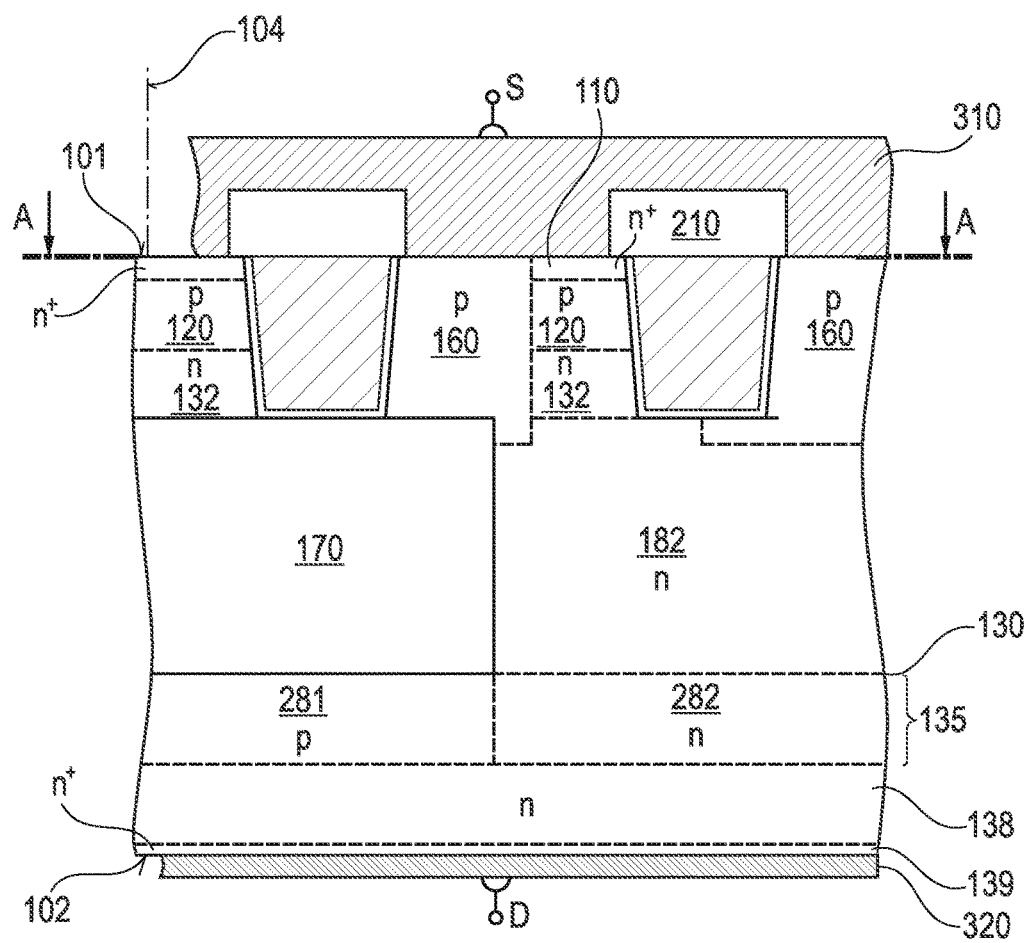

FIGS. 11A-11B show a silicon carbide device 500 with the fill structures 170 running orthogonal to the stripe-shaped gate structures 150.

Figure 12A:
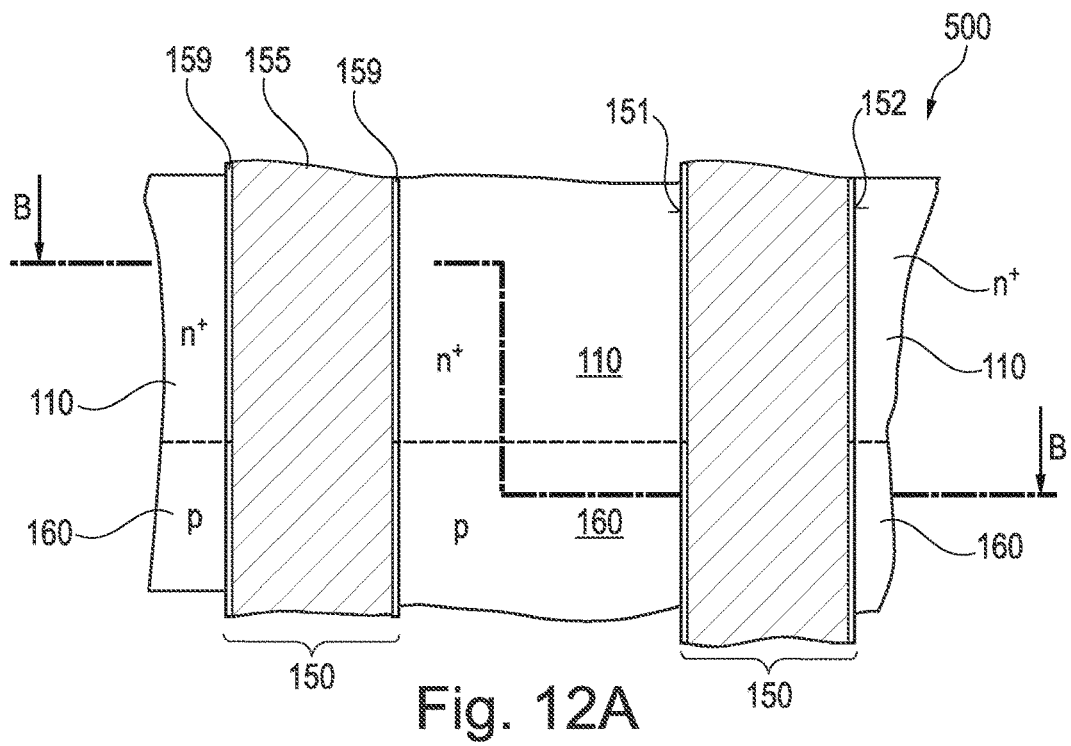
FIGS. 12A-12B are schematic horizontal and vertical cross-sectional views of a portion of a SiC SJ-TMOSFET according to an embodiment with two-sided channel.
Figure 12B:
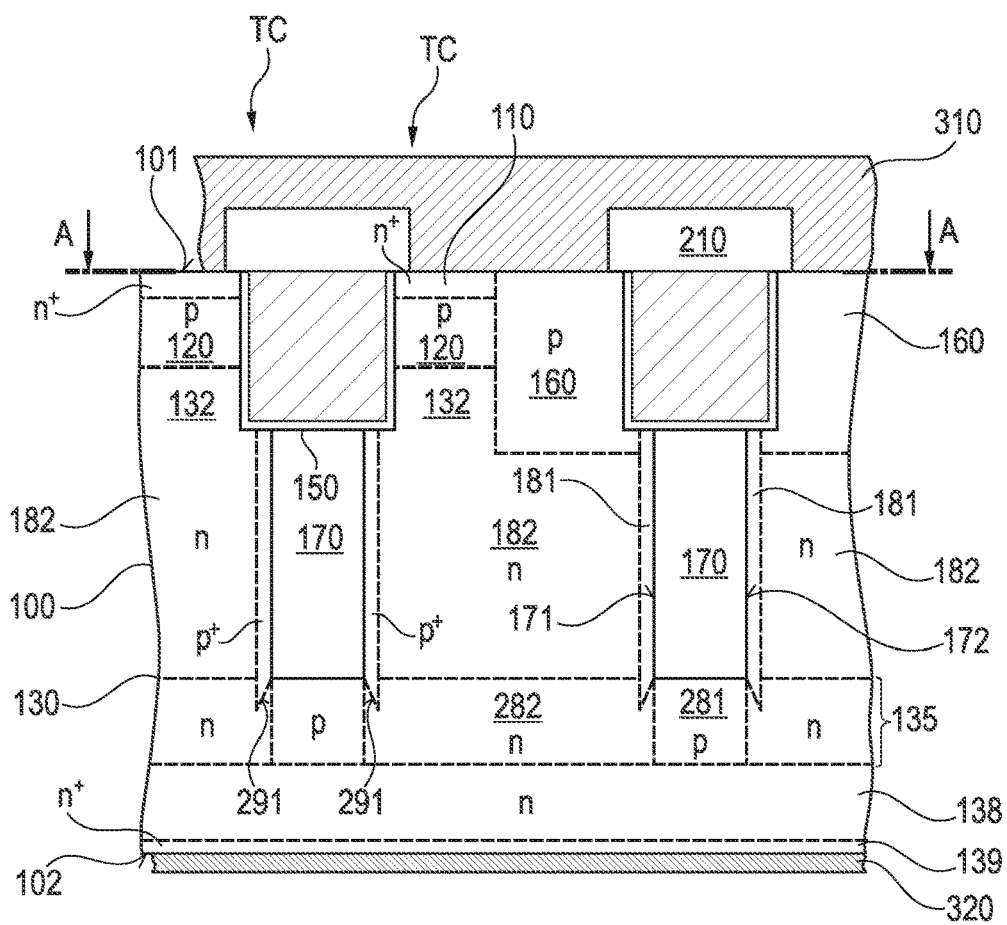

FIGS. 12A-12B show transistor cells TC based on gate structures 150 with two-sided channels and active first and second gate sidewalls 151, 152. Source regions 110, body regions 120, current spread regions 132 and shielding regions 160 extend from a first gate sidewall 151 of a first gate structure 150 to a second gate sidewall 152 of a second gate structure 150, wherein metal source contact structures may extend from the first surface 101 through the source regions 110 into the body regions 120. Portions including the source regions 110, the body regions 120 and the current spread regions 132 may alternate with shielding regions 160 along the lateral direction parallel to the lateral longitudinal extensions of the gate structures 150.

Figure 13A:
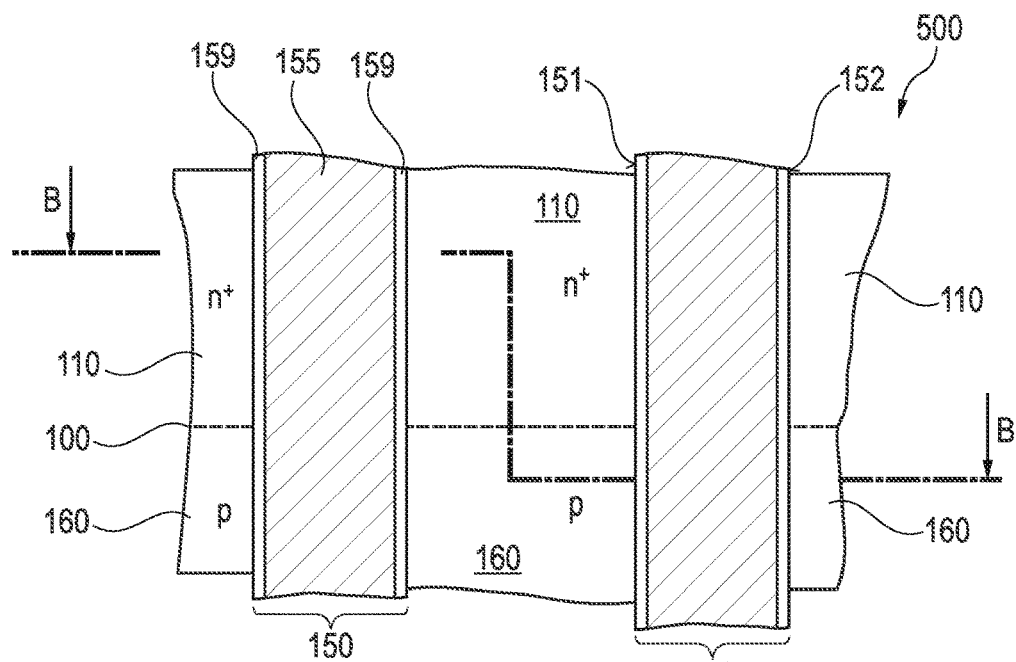
FIGS. 13A-13B are schematic horizontal and vertical cross-sectional views of a portion of a SiC SJ-TMOSFET according to an embodiment with two-sided channel.
Figure 13B:
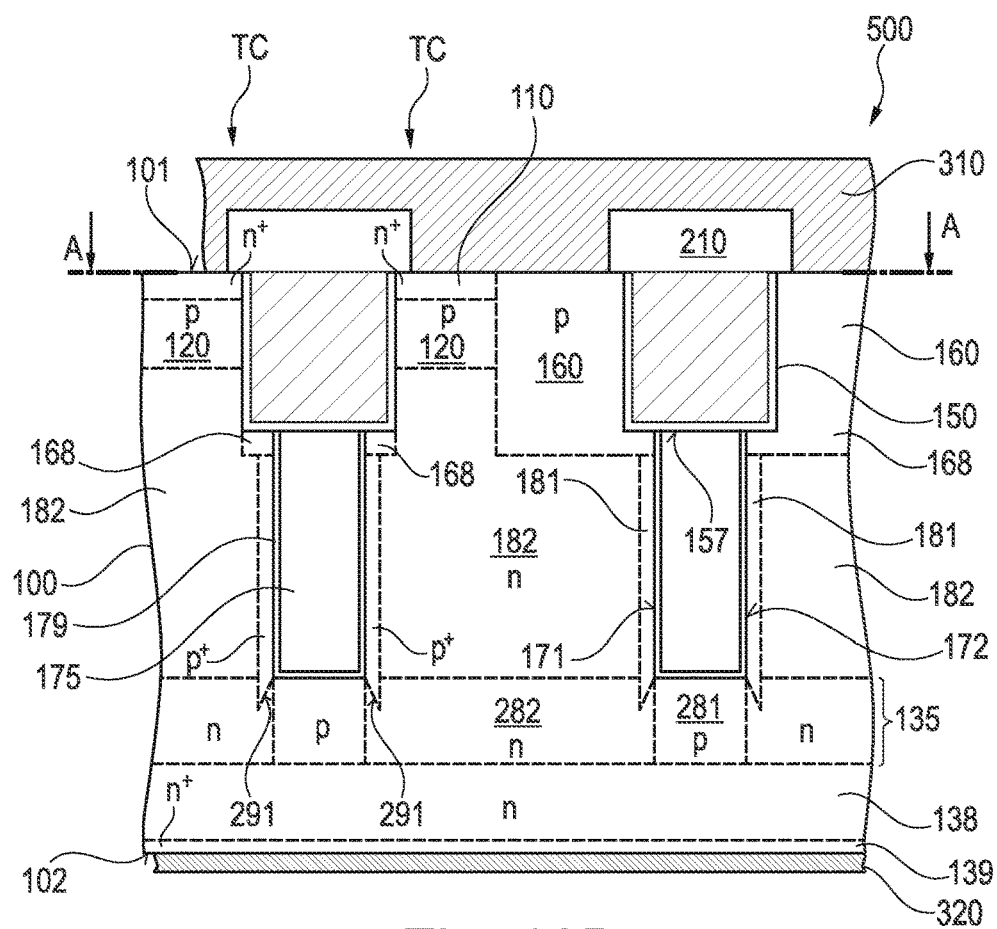

In FIGS. 13A-13B the shielding regions 160 include deep shielding portions 168 below (e.g., directly below) the gate structures 150. The deep shielding portions 168 may adjoin (e.g., directly adjoin) the first and second sidewalls 171, 172 of the fill structures 170. The deep shielding portions 168 may be in contact with a gate bottom surface 157. Lateral edges of the deep shielding portions 168 at the side averted from the fill structure 170 may be flush with the first and second gate sidewalls 151, 152. Alternatively, the deep shielding regions 168 may laterally extend beyond the first and second gate sidewalls 151, 152.

The fill structures 170 include a dielectric liner portion 179 and a fill portion 175. The dielectric liner portion 179 extends along the first and second sidewalls 171, 172 and along a bottom surface of the fill structures 170. The fill portion 175 is separated from the silicon carbide body 100 and may include doped or undoped semiconductor material or a dielectric material different from the material of the dielectric liner portion 179.

Figure 14A:
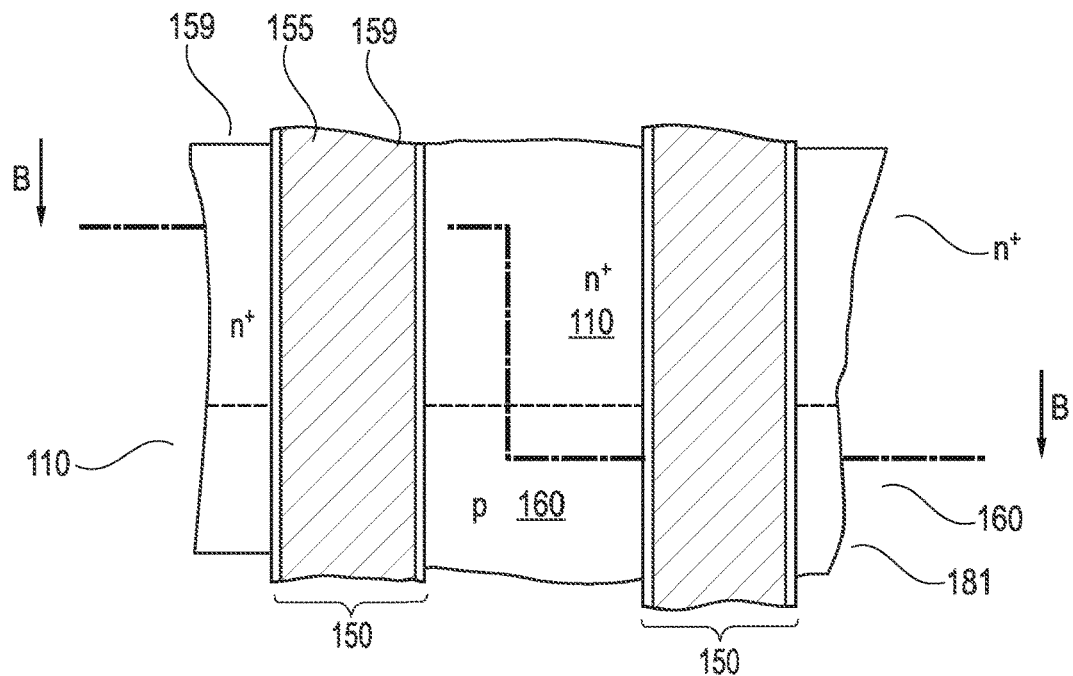
FIGS. 14A-14B are schematic horizontal and vertical cross-sectional views of a portion of a SiC SJ-TMOSFET according to an embodiment with a compensation structure including pairs of oppositely doped compensation layers.
Figure 14B:
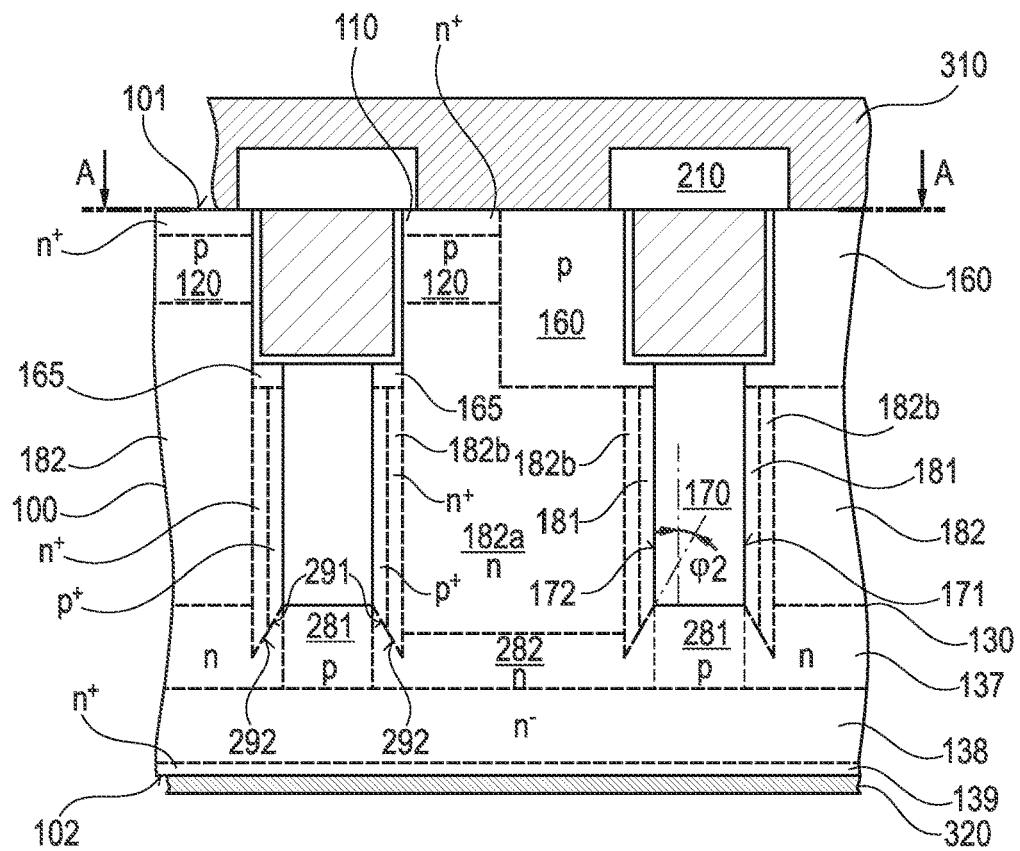

In FIGS. 14A-14B each n-type column of the compensation region 180 includes a second compensation region 182, wherein the second compensation region 182 includes a compensation portion 182*a* of an in-situ doped epitaxial layer and two second compensation layers 182*b*. The second compensation layers 182*b* are more heavily doped than the compensation portion 182*a*. The second compensation layer 182*b* and the compensation portion 182*a* form vertical unipolar junctions.

The second supplemental compensation regions 282 and the second compensation layers 182*b* may form second tilted junctions 292. A second tilt angle φ2 between the second tilted junctions 292 and the vertical extension 104 may deviate by at most ±5 degree from an angle between the vertical direction 104 and a lattice direction along which channeling occurs.

An embodiment may relate to a silicon carbide device that includes:

a silicon carbide body; a gate structure extending from a first surface into the silicon carbide body; a fill structure formed between the gate structure and a second surface of the silicon carbide body, wherein the second surface is opposite to the first surface; a compensation region of a first conductivity type, wherein the compensation region is formed in the silicon carbide body between the gate structure and the second surface; and a first compensation layer of a second conductivity type, wherein the first compensation layer is formed between a first sidewall of the fill structure and the compensation region, and wherein along a lattice direction, along which channeling occurs, a distribution of dopants of the second conductivity type in the silicon carbide body along a reference line from the fill structure to the second surface includes a tail portion.

The reference line is parallel to the crystal direction along which channeling occurs. The tail portion has a distance to the fill structure that is at least twice as large as a distance of the maximum value of the distribution of dopants to the fill structure along the reference line. In the tail portion, the dopant concentration is higher than (e.g., significantly higher than) according to a comparative ideal Gaussian distribution. The comparative ideal Gaussian distribution and the distribution of dopants of the second conductivity type have the same dose, range and straggle.

What is claimed is:

1. A method of manufacturing a silicon carbide device, comprising:
    providing a silicon carbide substrate comprising a drift layer of a first conductivity type and a trench extending from a main surface of the silicon carbide substrate into the drift layer;
    implanting first dopants through a first trench sidewall of the trench, wherein:
        the first dopants have a second conductivity type and are implanted at a first implant angle into the silicon carbide substrate;
        at the first implant angle channeling occurs in the silicon carbide substrate; and
        the first dopants form a first compensation layer extending parallel to the first trench sidewall; and
    an epitaxial layer is on the main surface;
    implanting further first dopants, through a further first sidewall of a further trench in the epitaxial layer on the main surface, to form a compensation layer extension of the first compensation layer in the epitaxial layer.

2. The method according to claim 1,
    implanting second dopants of the second conductivity type through the first trench sidewall, wherein the second dopants form a second compensation layer at a side of a third compensation layer averted from the trench.

3. The method according to claim 1, comprising:
    implanting second dopants of the second conductivity type through the first trench sidewall, wherein the second dopants form a second compensation layer.

4. The method according to claim 1, comprising:
    removing a sacrificial layer, comprising one or more portions of one or more compensation layers formed by implanting one or more dopants through the main surface of the silicon carbide substrate, at the main surface of the silicon carbide substrate.

5. The method according to claim 1, comprising:
    prior to forming at least one of the first compensation layer or a second compensation layer, forming an implantation mask on the main surface, wherein an opening in the implantation mask exposes the trench.

6. The method according to claim 1, comprising:
    implanting third dopants of the second conductivity type through a bottom of the trench, wherein the third dopants form a first supplemental compensation region.

7. A method of manufacturing a silicon carbide device, comprising:
    providing a silicon carbide substrate comprising a drift layer of a first conductivity type and a trench extending from a main surface of the silicon carbide substrate into the drift layer;
    implanting first dopants through a first trench sidewall of the trench, wherein the first dopants have a second conductivity type and form a first compensation layer extending parallel to the first trench sidewall;
    implanting second dopants through the first trench sidewall, wherein:
        the second dopants have the first conductivity type and form a second compensation layer; and
        the first compensation layer and the second compensation layer form a pn junction; and
    performing at least one of:
        implanting third dopants of the second conductivity type through the first trench sidewall, wherein the third dopants form a third compensation layer;
        implanting further first dopants, through a further first sidewall of a further trench in an epitaxial layer on the main surface, to form a compensation layer extension of the first compensation layer in the epitaxial layer; or
        removing a sacrificial layer, comprising one or more portions of one or more compensation layers formed by implanting one or more dopants through the main surface of the silicon carbide substrate, at the main surface of the silicon carbide substrate.

8. The method according to claim 7, wherein:
the first dopants are implanted at a first implant angle at which channeling occurs in the silicon carbide substrate.

9. The method according to claim 7, wherein:
the second dopants are implanted at a second implant angle at which channeling occurs in the silicon carbide substrate.

10. The method according to claim 7, comprising:
implanting further first dopants through a second trench sidewall, wherein:
the second trench sidewall is opposite to the first trench sidewall; and
the further first dopants form a further first compensation layer parallel to the second trench sidewall.

11. The method according to claim 10, comprising:
implanting further second dopants through the second trench sidewall, wherein the further second dopants form a further second compensation layer parallel to the second trench sidewall.

12. The method according to claim 11, wherein:
at least one of the further first dopants or the further second dopants are implanted at an implant angle at which channeling occurs in the silicon carbide substrate.

13. The method according to claim 7, comprising:
implanting the third dopants of the second conductivity type through the first trench sidewall at an implant angle at which channeling occurs in the silicon carbide substrate, wherein the third dopants form the third compensation layer at a side of the second compensation layer averted from the trench.

14. The method according to claim 7, comprising:
forming a fill structure in the trench; and
forming a gate electrode between the main surface and the fill structure.

15. The method according to claim 7, comprising:
forming a fill structure in the trench;
forming the epitaxial layer on the main surface;
forming the further trench in the epitaxial layer, the further trench exposing the fill structure; and
implanting the further first dopants through the further first sidewall of the further trench to form the compensation layer extension of the first compensation layer in the epitaxial layer.

16. The method according to claim 7, comprising:
implanting at least one of the first dopants or the second dopants through the main surface to form at least some of the sacrificial layer at the main surface, wherein the sacrificial layer comprises at least one of horizontal portions of the first compensation layer or horizontal portions of the second compensation layer; and after forming at least one of the first compensation layer or the second compensation layer, removing the sacrificial layer at the main surface of the silicon carbide substrate.

17. The method according to claim 7, comprising:
prior to forming at least one of the first compensation layer or the second compensation layer, forming an implantation mask on the main surface, wherein an opening in the implantation mask exposes the trench.

18. The method according to claim 7, comprising:
implanting fourth dopants of the second conductivity type through a bottom of the trench, wherein the fourth dopants form a first supplemental compensation region.

19. The method according to claim 7, comprising:
implanting the third dopants of the second conductivity type through the first trench sidewall, wherein the third dopants form the third compensation layer.

20. The method according to claim 7, comprising:
implanting the further first dopants, through the further first sidewall of the further trench in the epitaxial layer on the main surface, to form the compensation layer extension of the first compensation layer in the epitaxial layer.

21. The method according to claim 7, comprising:
removing the sacrificial layer, comprising the one or more portions of the one or more compensation layers formed by implanting the one or more dopants through the main surface of the silicon carbide substrate, at the main surface of the silicon carbide substrate.

22. A method of manufacturing a silicon carbide device, comprising:
providing a silicon carbide substrate comprising a drift layer of a first conductivity type and a trench extending from a main surface of the silicon carbide substrate into the drift layer;
implanting first dopants through a first trench sidewall of the trench, wherein:
the first dopants have a second conductivity type and are implanted at a first implant angle into the silicon carbide substrate;
at the first implant angle channeling occurs in the silicon carbide substrate; and
the first dopants form a first compensation layer extending parallel to the first trench sidewall; and
removing a sacrificial layer, comprising one or more portions of one or more compensation layers formed by implanting one or more dopants through the main surface of the silicon carbide substrate, at the main surface of the silicon carbide substrate.

* * * * *